(12) United States Patent
Bleiweiss et al.

(10) Patent No.: US 8,666,712 B2
(45) Date of Patent: Mar. 4, 2014

(54) PHYSICAL SIMULATIONS ON A GRAPHICS PROCESSOR

(75) Inventors: Avi I. Bleiweiss, Sunnyvale, CA (US); Gerard S. Baron, Torrington, CT (US)

(73) Assignee: ATI Technologies Inc., Markham, Ontario (CA)

( * ) Notice: Subject to any disclaimer, the term of this patent is extended or adjusted under 35 U.S.C. 154(b) by 870 days.

(21) Appl. No.: 11/491,169

(22) Filed: Jul. 24, 2006

(65) Prior Publication Data

US 2008/0021679 A1    Jan. 24, 2008

(51) Int. Cl.
*G06G 7/48* (2006.01)

(52) U.S. Cl.
USPC ............................................................ 703/6

(58) Field of Classification Search
USPC ............................................................ 703/6
See application file for complete search history.

(56) References Cited

U.S. PATENT DOCUMENTS

| | | | |
|---|---|---|---|
| 6,067,096 A | 5/2000 | Nagle | |
| 6,425,116 B1 * | 7/2002 | Duboc et al. | 716/102 |
| 2002/0130865 A1 * | 9/2002 | Venkataraman | 345/424 |
| 2005/0122338 A1 * | 6/2005 | Hong et al. | 345/546 |
| 2005/0165874 A1 | 7/2005 | Zhang et al. | |
| 2005/0171964 A1 | 8/2005 | Kulas | |
| 2005/0231504 A1 * | 10/2005 | Heng et al. | 345/420 |
| 2005/0250083 A1 | 11/2005 | Macri et al. | |
| 2006/0087509 A1 * | 4/2006 | Ebert et al. | 345/473 |

FOREIGN PATENT DOCUMENTS

| | | |
|---|---|---|
| EP | 1 253 558 A2 | 10/2002 |
| EP | 1 255 230 A3 | 11/2003 |
| EP | 1 594 091 A2 | 11/2005 |
| JP | 2005-322224 A | 11/2005 |

OTHER PUBLICATIONS

Jens Kruger et al., "Linear algebra operators for GPU implementation of numerical algorithms", Jul. 31, 2005, International Conference on Computer Graphics and Interactive Techniques ACM SIGGRAPH 2005 Courses, pp. 234-242.*

Dinesh Manocha, "General-purpose computations using graphics processors", Aug. 2005, Computer, vol. 38, issue 8, pp. 85-88.*

David C. Banks et al., "InvIncrements: incremental software to support visual simulation", Jan. 16, 2006, Proceedings of the SPIE, vol. 6060, pp. 60600I-1-60600I-7.*

Jens Kruger et al., "GPU simulation and rendering of volumetric effects for computer games and virtual environments", Oct. 7, 2005, Computer Graphics Forum, vol. 24, issue 3, pp. 685-693.*

(Continued)

*Primary Examiner* — Kamini S Shah
*Assistant Examiner* — Russ Guill
(74) *Attorney, Agent, or Firm* — Sterne, Kessler, Goldstein & Fox P.L.L.C.

(57) ABSTRACT

The present invention is directed to a method, computer program product, and system for performing physics simulations on at least one graphics processor unit (GPU). The method includes the following steps. First, data representing physical attributes associated with at least one mesh are mapped into a plurality of memory arrays to set up of a linear system of equations that governs motion of the at least one mesh depicted in a scene. Then, computations are performed on the data in the plurality of memory arrays using at least one pixel processor to solve the linear system of equations for an instant of time, wherein modified data representing the solution to the linear system of equations for the instant of time are stored in the plurality of memory arrays.

31 Claims, 15 Drawing Sheets

(56) References Cited

OTHER PUBLICATIONS

Georgios E. Tarantilis, "Simulating clouds with procedural texturing techniques using the GPU", 2004, Naval Postgraduate School, pp. 1-55.*
Richard C. Dorf, "Modern Control Systems", third edition, 1980, Addison-Wesley Publishing Company, p. 52.*
Horng-Shyang Liao et al., "Fast rendering of dynamic clouds", 2005, Computers & Graphics, vol. 29, pp. 29-40.*
Cyril Zeller, "Cloth Simulation on the GPU," 2005, ACM SIGGRAPH 2005 Sketches, one page.*
Invitation to Pay Additional Fees for International Appl. No. PCT/US2007/016421, dated Feb. 4, 2008, 11 pages.
Strzodka et al., "Scientific Computation for Simulations on Programmable Graphics Hardware", vol. 13, No. 8, Nov. 2005, pp. 667-680.
Sørensen et al., "An Introduction to GPU Accelerated Surgical Simulation", Biomedical Simulation Lecture Notes in Computer Science; LNCS, Springer-Verlag, BE, vol. 4072, Jun. 22, 2006, pp. 93-104.
Volino P. et al., "Implementing Fast Cloth Simulation with Collision Response", Proceedings Computer Graphics Int'l 2000 IEEE Comput. Soc Los Alamitos, CA, USA, 2000, pp. 257-266.
Luekbke et al., "GPGPU: General Purpose Computation on Graphics Hardware" SIGGRAPH 2004, Lecture Notes, 2004, pp. 1-3.
Govindaraju et al., "Quick-Cullide: Fast Inter-and Intra-Object Collision Culling Using Graphics Hardware", Virtual Reality., 2005, pp. 59-66.
Wong et al., "GPU-Based Intrinsic Collision Detection for Deformable Surfaces" Computer Animation & Virtual Worlds Wiley UK, vol. 16, No. 3-4, Jul. 2005, pp. 153-161.
Choi et al., "Rapid Pairwise Intersection Tests Using Programmable GPUs", The Visual Computer, vol. 22, No. 2, Feb. 1, 2006, pp. 80-89.
Bleiweiss: "GPU for Game Computing" Technitron Seminar, Aug. 21, 2006, pp. 1-47.
International Search Report and Written Opinion for Int'l Application No. PCT/US2007/016421, Date of mailing: Apr. 10, 2008, 20 pgs.
"What is PhysX," printed from http://www.ageia.com/physx/what_is_physx.html, 2 pages, printed on Aug. 9, 2006.
"The First Dedicated Physics Processor for PC Games," printed from http://www.ageia.com/pdf/ds_product_overview.pdf; 4 pages, printed on Aug. 9, 2006.
Advance Gaming Physics Defining the New Reality in PC Hardware, Mar. 2006, printed from http://www.ageia.com/pdf/wp_advanced_gaming_physics.pdf, 8 pages, printed on Aug. 9, 2006.
"Physics, Gameplay and the Physics Processing Unit," Mar. 2005, printed from http://www.ageia.com/pdf/wp_physics_and_gaming.pdf, 5 pages, printed on Aug. 9, 2006.

English translation of Office Action dated Oct. 8, 2012, in Chinese Patent Application No. 200780034737.3, ATI Technologies, Inc., filed Jul. 24, 2006 (7 pages).
English translation of Office Action dated Apr. 26, 2012, in Japanese Patent Application No. 2009-521775, ATI Technologies, ULC, filed Jul. 20, 2007 (4 pages).
English translation of Office Action dated Feb. 22, 2012, in Chinese Patent Application No. 200780034737.3, ATI Technologies Inc., filed Jul. 24, 2006.
Notification of the First Office Action, dated Jan. 10, 2011, for Chinese Patent Appl. No. 200780034737.3, 10 pages (including English translation).
Communication pursuant to Article 94(3) EPC, dated Mar. 9, 2011, for European Patent Appl. No. 07810628.3-2224, 4 pages.
Notice of Reasons for Rejection, dated Nov. 9, 2011, for Japanese Patent Appl. No. 2009-521775, 5 pages (including English translation).
Inquiry, dated Jan. 31, 2013, for Japanese Patent Appl. No. 2009-521775, 7 pages (including English translation).
Notice of Reasons for Rejection, dated Feb. 14, 2013, for Japanese Patent Appl. No. 2012-028708, 4 pages (including English translation).
Notice of Reasons for Rejection, dated Feb. 14, 2013, for Japanese Patent Appl. No. 2012-028709, 5 pages (including English translation).
Lee Howes, "ASC2GPU—Stream Compilation to Graphics Cards," Jun. 15, 2005, http://citeseerx.ist.psu.edu/viewdoc/download?doi=10.1.1.101.3378&rep=rep1&type=pdf.
Official Action and English translation of Official Action mailed on Jul. 11, 2013, in Japanese Patent Application No. 2009-521775.
Official Action and English translation of Official Action mailed on Aug. 12, 2013, in Japanese Patent Application No. 2012-028708.
Official Action and English translation of Official Action mailed on Aug. 12, 2013, in Japanese Patent Application No. 2012-028709.
Official Action mailed on Oct. 1, 2013, in Japanese Patent Application No. 2012-188538.
David Baraff et al., "Large Steps in Cloth Simulation," Siggraph 98, Orlando, Jul. 19-24, Computer Graphics Proceedings, Annual Conference Series, 1998, pp. 43-54.
Kwang-Jin Choi et al., "Stable but Responsive Cloth," Association for Computing Machinery, Inc., pp. 604-611, 2002.
Eduardo Tejada et al., "Large Steps in GPU-based Deformable Bodies Simulation," Simulation Practice and Theory, pp. 1-14, Aug. 3, 2005.
Internet printout from http://www.havok.com/content/view/187/77/, "Havok FX™," 3 pages, printed on Jul. 19, 2006.

* cited by examiner

Vertex Buffer (3x3)

FIG. 14A

Index Buffer (3x2)

FIG. 14B

| Face #0 (0, 1, 2) | Face #1 (2, 1, 3) | Face #2 (1, 4, 3) | Face #3 (3, 4, 5) | Face #4 (5, 4, 6) |

FIG. 15B

| Vertex #0 | Vertex #1 | Vertex #2 | Vertex #3 | Vertex #4 | Vertex #5 | Vertex #6 | Vertex #7 |

FIG. 15A

PHYSICAL SIMULATIONS ON A GRAPHICS PROCESSOR

BACKGROUND OF THE INVENTION

1. Field of the Invention

The present invention is generally directed to graphics processor units, and more particularly to using graphics processor units to perform game physics simulations.

2. Background Art

An application, such as a video game, running on a computer system may require both physics simulations and graphics rendering. For example, FIG. 1 depicts a block diagram 100 of a typical pipeline for computing and displaying the motion of one or more characters depicted in a scene of a video game. In a step 110, physics simulations are performed to determine the motion of the one or more characters depicted in the scene. Then in a step 120, the results of the physics simulations are graphically rendered for visualization by an end-user.

The physics simulations of step 110 are typically performed by a physics engine that is executed on a central processing unit (CPU) or a dedicated device of the computer system. Then, the graphics rendering of step 120 is performed by a graphics processing unit (GPU). Ultimately, however, the results produced by the physics engine are used to modify the graphics of the video game (or, more generally, the application), and therefore will be passed to the GPU in some form. Because the results from the physics engine must be passed to the GPU for rendering, latency and bandwidth problems may arise. Furthermore, as a general processing unit, a CPU does not possess the parallel processing capabilities of a GPU.

Given the foregoing, what is needed is a method, computer program product, and system for performing physics simulations on one or more GPUs.

BRIEF SUMMARY OF THE INVENTION

Embodiments of the present invention, which may include a method, computer program product, and system take advantage of the parallel processing capabilitites available on a GPU to enable faster frame rates as compared to physics simulations executed on a typical CPU. Furthermore, such a method, computer program product, and system utilize an implicit integration technique in the performance of the physics simulations to avoid the relatively small time steps required in explicit integration techniques. Moreover, procedural forces and torques can be represented as a shader program that executes on the GPU(s). In addition, a GPU-based physics simulator can be able to automatically replace a conventional software dynamics solver that typically executes physics simulations on a computer system. Embodiments of the present invention meet the above-identified needs by providing a method, computer program product, and system for performing physical simulations on one or more GPUs. Such a method, computer program product, and system for performing physics simulations on one or more GPUs takes advantage of the parallel processing capabilities available on the GPU(s), thereby enabling faster frame rates compared to physics simulations executed on a typical CPU. Furthermore, such a method, computer program product, and system utilize an implicit integration technique in an embodiment to perform physics simulations, thereby avoiding the relatively small time steps required in explicit integration techniques. Moreover, in accordance with an embodiment of the present invention procedural forces and/or torques are representable as a shader program that executes on the GPU(s). In addition, a GPU-based physics simulator in accordance with an embodiment of the present invention may be used to automatically replace a conventional software dynamics solver that typically executes physics simulations on a computer system.

In accordance with an embodiment of the present invention there is provided a method for performing physics simulations on at least one GPU. The method includes the following steps. First, data representing physical attributes associated with at least one mesh are stored in a plurality of video memory arrays to set up a linear system of equations that govern motion of the at least one mesh depicted in a scene. Then, computations are performed on the data in the plurality of video memory arrays using at least one pixel processor to solve the linear system of equations for an instant of time, wherein modified data representing the solution to the linear system of equations for the instant of time are stored in the plurality of video memory arrays.

In accordance with another embodiment of the present invention there is provided a computer program product comprising a computer usable medium having control logic stored therein for causing at least one GPU to perform physics simulations. The control logic includes a computer readable first and second program code. The computer readable first program code causes the at least one GPU to store data representing physical attributes associated with at least one mesh in a plurality of video memory arrays to set up a linear system of equations that governs motion of the at least one mesh depicted in a scene. The computer readable second program code causes the at least one GPU to perform computations on the data in the plurality of video memory arrays to solve the linear system of equations for an instant of time, wherein modified data representing the solution to the linear system of equations for the instant of time are stored in the plurality of video memory arrays.

In accordance with a further embodiment of the present invention there is provided a system for performing physics simulations. The system includes a memory that stores a plurality of video memory arrays and at least one pixel processor coupled to the memory. The plurality of video memory arrays store data representing physical parameters associated with at least one mesh to set up a linear system of equations that governs motion of the at least one mesh depicted in a scene. The at least one pixel processor performs computations on the data in the plurality of video memory arrays to solve the linear system of equations for an instant of time, resulting in modified data representing the solution to the linear system of equations for the instant of time.

Further features and advantages of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate the present invention and, together with the description, further serve to explain the principles of the invention and to enable a person skilled in the relevant art(s) to make and use the invention.

FIG. 14A depicts an example manner in which contents of a vertex buffer are mapped onto an array of 3 by 3 elements in accordance with an embodiment of the present invention.

FIG. 14B depicts an example manner in which contents of an index buffer are mapped onto a 3 by 2 grid in accordance with an embodiment of the present invention.

FIG. 15A depicts an example in which a vertex buffer stores eight vertex positions.

FIG. 15B depicts an example in which an index buffer stores five faces corresponding to the vertex positions stored in the example vertex buffer depicted in FIG. 15A.

Figure 1:
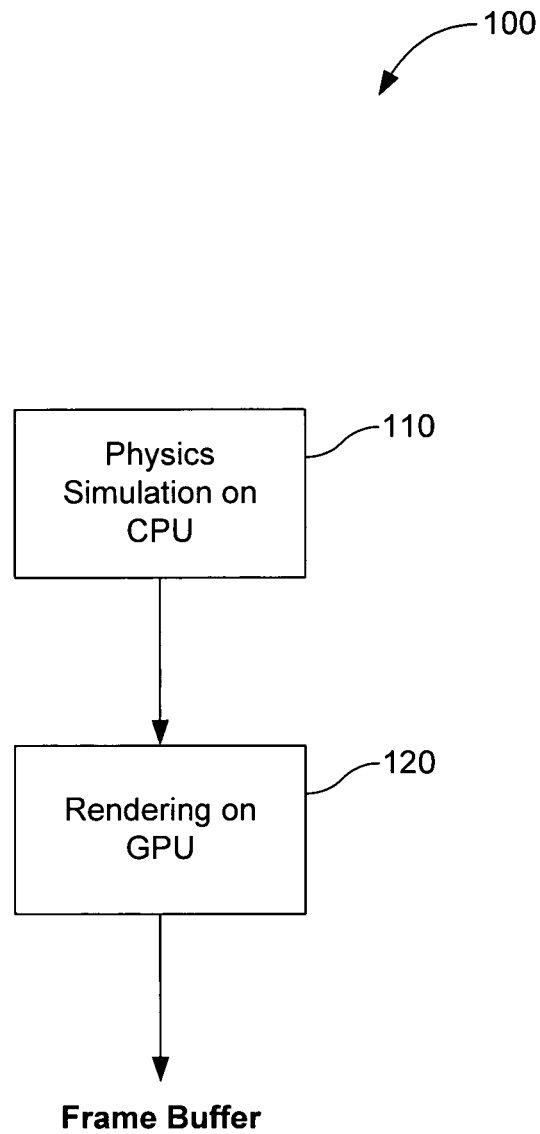
FIG. 1 depicts a block diagram illustrating a typical graphics pipeline.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION OF THE INVENTION

I. Overview of Physics Simulation On One Or More GPUs
   A. An Example Workflow For Performing Physics Simulations On One Or More GPUs
   B. An Example GPU For Executing Physics Simulations II. An Example Physical Simulation Interface
   A. An Example Physics Simulation Software Interface (FYSI)
   B. An Example Physics Scene Description Language (FYSL)
   C. An Example Manner In Which Physical Parameters Associated With A Point-Mesh May Be Received III. An Example Method For Performing Physics Simulations On One Or More GPUs
   A. Overview Of Method
   B. An Example Physical Model For Cloth Simulation
   C. An Example Implementation For Simulating Cloth On The GPU(s)
   D. Example Code Written In FYSL IV. Example Computer Implementation V. Conclusion

I. OVERVIEW OF PHYSICS SIMULATION ON ONE OR MORE GPUS

Embodiments of the present invention are directed to a method, computer program product, and system for performing physics simulations on one or more GPUs. Such physics simulations may be used, for example, for performing game computing of an application (such as a video game). To perform physics simulations on one or more GPUs in accordance with an embodiment of the present invention, physical parameters associated with a mesh are mapped directly into video memory. The mesh may represent any physical object, such as a solid object, a volume, a fluid, or a cloth. Presented in more detail herein is an example method for performing physics simulations of a cloth on one or more GPUs. After the mesh is mapped into the video memory, at least one pixel processor of the GPU(s) performs computations on the data in the video memory using a compiled shader program. Performing physics simulations directly on the GPU(s) may reduce the latency and bandwidth issues associated with typical physics simulations performed on a CPU.

Throughout the specification, methods, computer program products, and systems for performing physics simulations on one or more GPUs are described in terms of an example physics simulation software interface (called FYSI) and a physics scene description language (called FYSL). The invention, however, is not limited to FYSI and FYSL. Based on the description herein, a person skilled in the relevant art(s) will understand that methods, computer program products, and systems for performing physics simulations on one or more GPUs may be implemented using other types of physics simulation software interfaces and other types of physics scene description languages.

It is noted that references in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Described in more detail below are embodiments of the present invention for mapping physics simulations onto one or more GPUs. In Section II, an example interface for performing this mapping is described. Section III presents an example method for performing physics simulations on one or more GPUs, including a particular implementation of the example method for simulating cloth on the GPU(s). In Section IV, an example computer system for implementing physics simulations on one or more GPUs is described. However, before describing embodiments of the present invention in detail, it is helpful to describe an overview of an example workflow for performing physics simulation on one or more GPU(s) and an example GPU for implementing physics simulations.

A. An Example Workflow for Performing Physics Simulations on One or More GPUs

Figure 2:
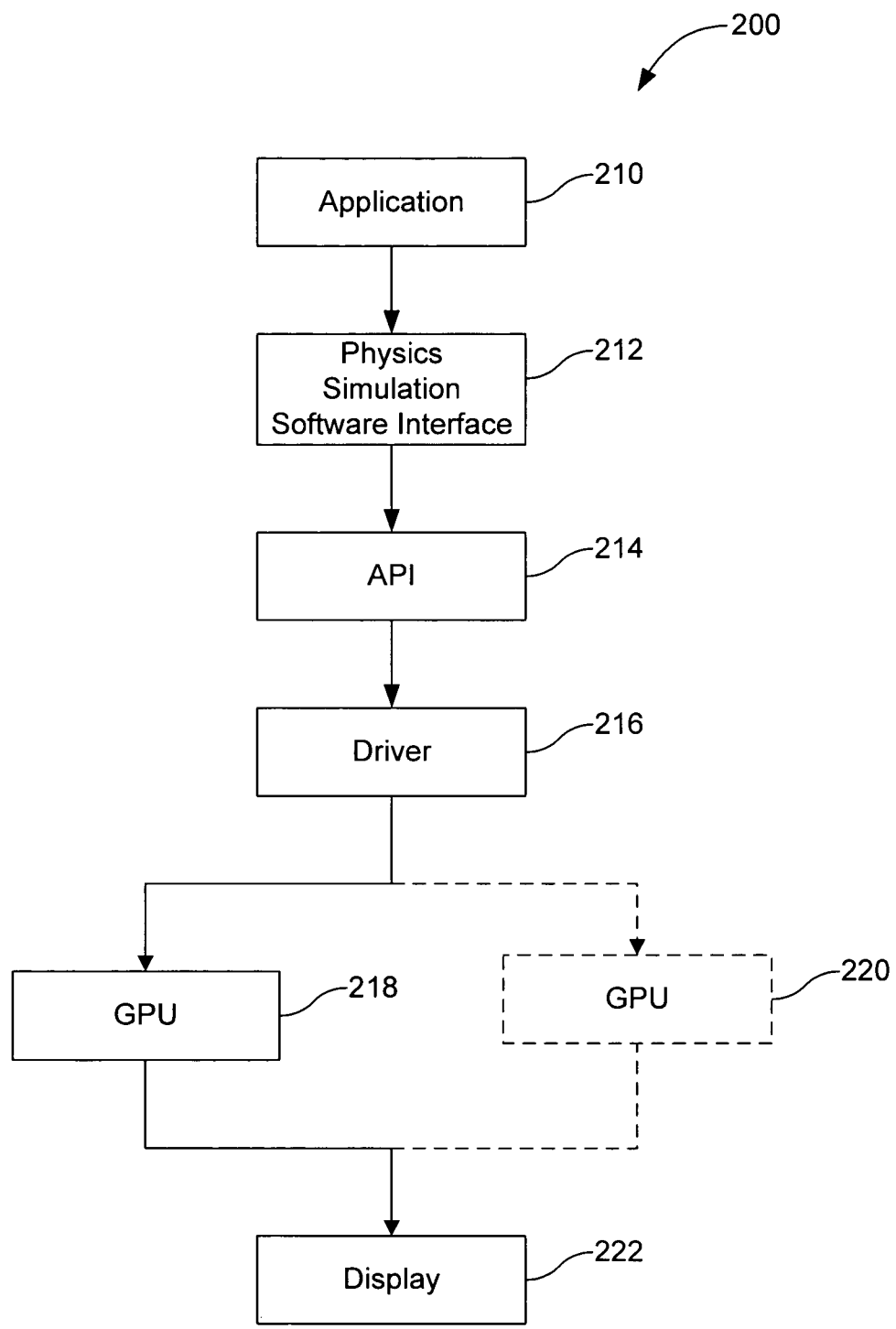
FIG. 2 depicts a block diagram of an example work flow for simulating physics on a GPU in accordance with an embodiment of the present invention.

FIG. 2 depicts a block diagram 200 of an example workflow for performing physics simulations on a GPU. Block diagram 200 includes various software elements, such as an application 210, physics simulation software interface 212, application programming interface 214, and a driver 216, that are executed on a host computer system and interact with graphics hardware elements—such as a GPU 218, an (optional) GPU 220, and/or a plurality of GPUs (not shown)—to simulate physics and render frames for output to a display 222. The individual elements of block diagram 200 are now described in more detail.

As shown in FIG. 2, block diagram 200 includes an application 210. Application 210 is an end user application that requires graphics processing capability, such as a video game application. Application 210 invokes physics simulation software interface 212. In an embodiment, physics simulation software interface 212 is an interface called FYSI developed by ATI Technologies Inc. FYSI is described in more detail herein. However, as mentioned above, the invention is not limited to FYSI. Other physics simulation software interfaces may be used without deviating from the spirit and scope of the present invention, as would be apparent to a person skilled in the relevant art(s). Physics simulation software interface 212 creates a simple extensible abstract machine (SEAM) on which physics simulations are performed.

Physics simulation software interface 212 communicates with API 212. Several APIs are available for use in the graphics processing context. APIs were developed as intermediaries between application software, such as application 210, and graphics hardware on which the application software runs. With new chipsets and even entirely new hardware technologies appearing at an increasing rate, it is difficult for application developers to take into account, and take advantage of, the latest hardware features. It is also becoming increasingly difficult to write applications specifically for each foreseeable set of hardware. APIs prevent applications from having to be too hardware-specific. The application can output graphics data and commands to the API in a standardized format, rather than directly to the hardware. Because physics simulation software interface 212 communicates directly with API 214, there is no need to modify available APIs. Examples of available APIs include DirectX® or OpenGL®. API 210 can be any one of the available APIs for running graphics applications. As will be appreciated by those of ordinary skill in the art, alternative embodiments of the invention could integrate physics simulation software interface 212 into API 214 thus enabling application 210 to work with a single software interface. In such an embodiment, driver 216 would then be modified to comply with such a single interface combining aspects of physics simulation software interface 212 with API 214.

API 210 communicates with driver 216. Driver 216 is typically written by the manufacturer of the graphics hardware, and translates standard code received from the API into native format understood by the graphics hardware. Driver 216 also accepts input to direct performance settings for the graphics hardware. Such input may be provided by a user, an application or a process. For example, a user may provide input by way of a user interface (UI), such as a graphical user interface (GUI), that is supplied to the user along with driver 216.

Driver 216 communicates with first GPU 218 and/or second GPU 220. First GPU 218 and second GPU 220 are graphics chips that each includes a shader and other associated hardware for performing physics simulations and graphics rendering. In an embodiment, physics simulations and graphics rendering are performed on a single GPU, such as first GPU 218. In an alternative embodiment, physics simulations are executed one GPU (or core), such as first GPU 218, and graphics are rendered on another GPU (or core), such as second GPU 210. In a still further embodiment, physics simulations and graphics rendering are performed by a plurality of GPUs. After the physics simulations, rendered graphics are sent to display unit 222 for display. GPU 218 and GPU 220 may each be implemented as described in the next section.

B. An Example GPU for Executing Physics Simulations

The architecture of a GPU in accordance with an embodiment of the present invention enables a single instruction, multiple data (SIMD) technique to be employed resulting in data level parallelism. Such a GPU includes processors and textures (or video memory). The processors perform operations on data in the textures. Results of the operations are written into a render target (a portion of video memory). A render target may be reassigned as a texture or as a subsequent computation. The textures are arranged into arrays of memory, such as 1D-, 2D-, or 3D-arrays of memory. Shaders are small programs or sets of instructions that are written for the processors to perform specific computations on the data in the textures.

Figure 3:
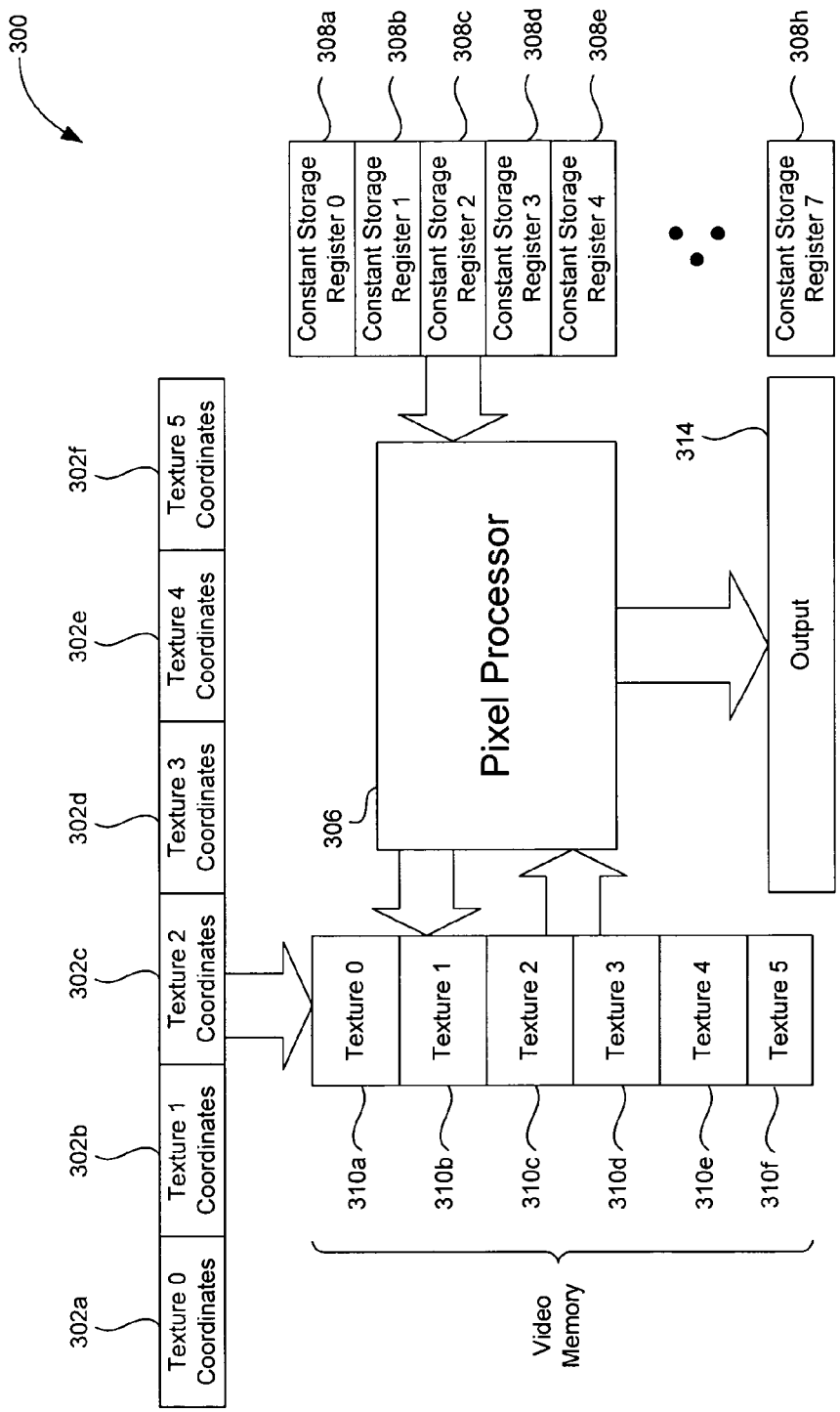
FIG. 3 depicts a block diagram of an example pixel processor in accordance with an embodiment of the present invention.

FIG. 3 depicts a block diagram 300 illustrating an example pixel processor for executing physics simulations on one or more GPUs in accordance with an embodiment of the present invention. Included in block diagram 300 are six textures 310a-310f, eight constant storage registers 308a-308h, and a pixel processor 306. Texture coordinates 302 of a memory array (such as a 1D-, 2D-, or 3D-memory array) may be written into textures 310. In contrast, constant data values are stored in constant storage registers 308. Pixel processor 306 performs operations on data in textures 310 and/or constant storage registers 308. After performing these operations, pixel processor 306 may write data into textures 310 and/or produce an output 314. The operations performed by pixel processor 306 are specified by instructions that are similar to CPU assembly language instructions.

An example manner in which a mesh is represented in the GPU vertex processor is now described. A mesh is composed of a pair of one dimensional lists—a vertex buffer and an index buffer. As illustrated in FIG. 15A, the vertex buffer retains vertex positions. The embodiment shown in FIG. 15A, illustrates seven vertex positions. FIG. 15A is used for illustrative purposes only, and not limitation. A different number of vertex positions may be stored in the vertex buffer, as would be apparent to a person skilled in the relevant art(s). As illustrated in FIG. 15B, the index buffer stores face indices. FIG. 15B is used for illustrative purposes only, and not limitation. A different number of face indices may be stored in the index buffer, as would be apparent to a person skilled in the relevant art(s). A face represents a triangle and the face indices point into the vertex buffer. For example, a face stored in the index buffer may include three vertices, labeled 0, 1, and 2. Each of these labeled vertices points to a separate location in the vertex buffer.

An example manner in which a mesh is mapped into video memory is now described. This example manner is presented for illustrative purposes only, and not limitation. Other manners for mapping a mesh into video memory will be apparent to a person skilled in the relevant art(s) based on the description contained herein. The vertex and index lists are each mapped onto an optimized N dimensional array in video memory to better exploit pixel engine parallelism. An optimized N dimensional array is such that the N dimensional array fits the maximum addressability of the GPU(s) used for performing physics simulations. The vertex buffer maps onto an array of n by m elements and the index buffer maps onto an l by k grid. Each element in video memory (e.g., a pixel) is composed of a four component vector. The first three components represent the x, y, and z components of position, and the fourth component is a boundary tag (which is described below).

In an embodiment, the vertex and index lists are each mapped onto an optimized two dimensional array in video memory, as shown in FIGS. 14A and 14B, respectively. In this embodiment, the vertex buffer maps onto an array of 3 by 3 elements and the index buffer maps onto a 3 by 2 grid.

In the case of multiple meshes in a scene, all the meshes are coalesced into one two dimensional composite mesh in accordance with an embodiment of the present invention. The composite mesh records in video memory sub-mesh boundaries by tagging each sub-mesh with a unique identification ("id"). The id is recorded as the fourth component of each of the grid element. Mesh compositing alleviates both the overhead associated with a small size mesh download to video memory, and relieves hardware resource pressure of total number of textures usage.

II. AN EXAMPLE PHYSICAL SIMULATION INTERFACE

As mentioned above with respect to FIG. 2, physics simulation software interface 212 allows an application 210 to perform physics simulations on GPU 218, GPU 220, and/or a plurality of GPUs. In this section, an example physics simulation interface is described. First, an example physics simulation software interface, called FYSI, is described. Then, an example scene description language, called FYSL, for expressing the abstract concepts embodied in FYSI is described. Finally, there is described an example manner for converting physical parameters and attributes into FYSL in order to perform physics simulations on one or more GPUs using FYSI, and thereby by-pass a conventional software dynamics solver. It is to be appreciated, however, that these embodiments are presented for illustrative purposes only, and not limitation. Based on the description contained herein, a person skilled in the relevant art(s) will understand how to implement other types of physics simulation software interfaces for performing physics simulations on one or more GPUs.

A. An Example Physics Simulation Software Interface (FYSI)

FYSI—an example physics simulation interface software system—is a vehicle for mapping traditional CPU based simulation related computation onto the GPU. By using FYSI higher interaction rates may be achieved compared to those commonly experienced in game physics. FYSI departs from the conventional occlusion query modality for mapping collision detection and resolution onto graphics hardware. Instead, it proposes a global simulation solution leveraging ever increasing hardware programmable shading power.

Figure 4:
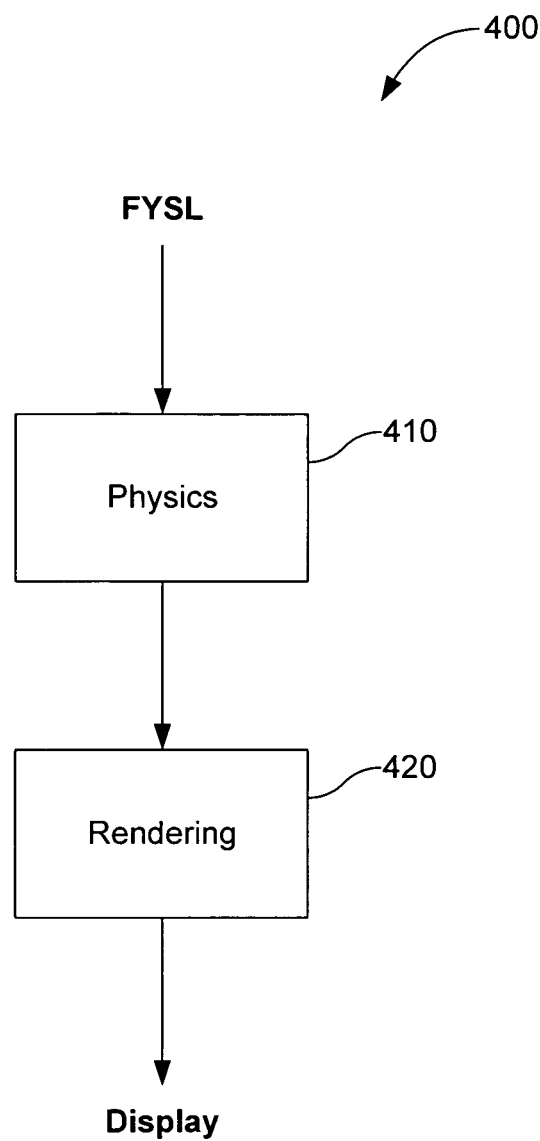
FIG. 4 depicts a block diagram of an example physics/rendering pipeline in accordance with an embodiment of the present invention.

FIG. 4 depicts a block diagram 400 of an extended graphics pipeline by which a physics simulation stage 410 feeds a visual rendering stage 420. Physics simulation stage 410 takes in a physics description abstraction. The description provides both simulation and scene definitions. A scene is composed of actors, each with its own set of shape, dynamics and matter properties. The shape establishes the geometric nature of the participating actor, dynamics constitutes the physical behavior and matter furnishes material contact attributes. In addition, the scene optionally declares joints, which introduce movement constraints on a pair of actors. The simulation process commences in iterative discrete uniform steps, time wise. The physics description abstraction is in the form of a language called FYSL, which stands for Physics Scene Description Language. FYSL is platform independent, extensible and provides constructs to partition the simulation task across multiple GPUs, if necessary.

In a rendering block 420, the simulation results from the physics block 410 are rendered for visualization. In general, several physics simulation steps are performed for every rendering frame. Hence, the cumulative frame rate of both the simulation and visual rendering tasks determine the final interactive rate to the user. FYSI is a software development environment for providing physics simulation requirements. Initially, the FYSL input abstraction is parsed and converted onto a collection of internal scene data structures. Simulation then commences in a GPU. Simulation results are either passed directly to the visual rendering thread by means of shared textures or optionally are available to be read back by the programmer. Finally, FYSI implements a compute abstraction layer (CAL) wrapper on top of a graphics hardware interface for ease of extensibility. In an embodiment, FYSI interfaces with Microsoft DirectX® (versions 9.0 and 10.0); however, a person skilled in the relevant art(s) will appreciate that FYSI can interface with OpenGL® or some other API.

The physics simulation field in games is rather broad and covers a large gamut of topics. Amongst them is rigid body, cloth, fluid and in general deformable body simulation. The type of physics simulation implies the format of data passed from the simulation stage onto the visual rendering stage. In the case of rigid bodies, FYSI passes to the visual thread transform data, which represents the incremental state change of objects entered in a recent simulation session. Cloth models return perturbed original particle positions and for fluids or deformable bodies the resultant simulated shape is almost non-related to its initial definition. Typically, the physics simulation process is compute bound and bandwidth requirements from it onto the visual rendering thread is relatively limited.

Figure 5:
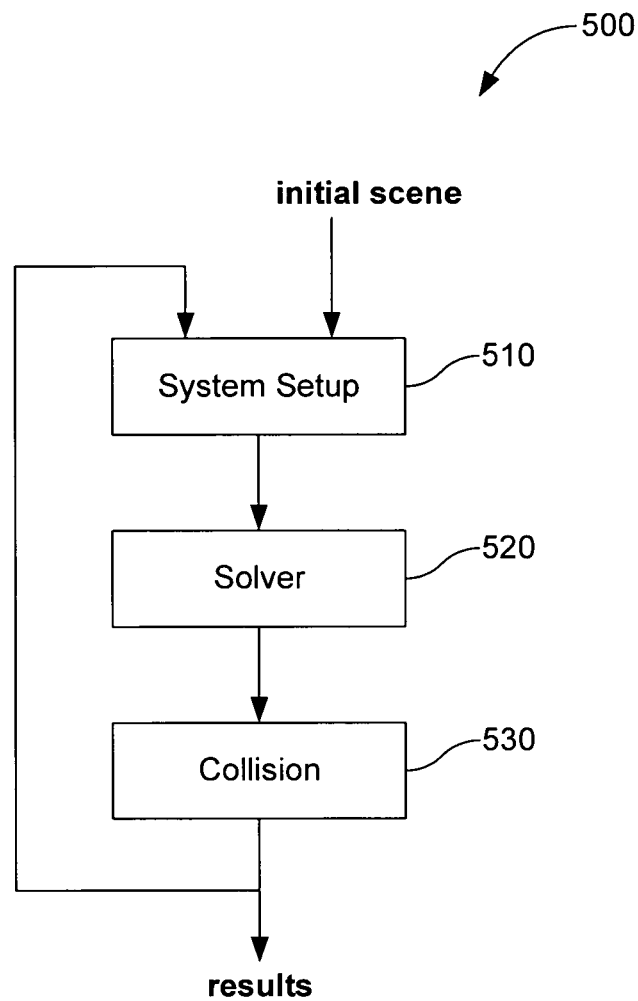
FIG. 5 depicts a block diagram of an example physics simulation pipeline performed on a GPU in accordance with an embodiment of the present invention.

At a fairly high level a generic pipeline 500 can be formed and applied to most of the aforementioned physics simulation aspects as shown in FIG. 5. Pipeline 500 includes a system setup stage 510, a solver stage 520, and a collision stage 530. In system setup stage 510, input is either an initial scene description or an incremental state update of the scene. The role of system setup stage 510 is to perform an integration of the physical model and arrive at a linear system of the form A*x=b, wherein A is a matrix, x is unknown and b is a known vector.

In solver stage 520, the linear system is resolved and the state of a depicted scene is updated based on the solution to the linear system. The linear system is resolved using numerical techniques which are available to a person skilled in the relevant art(s). In an embodiment, the linear system is resolved using a modified conjugate gradient method described in more detail below and in David Baraff and Andrew Witkin, "Large Steps in Cloth Simulation," Computer Graphics Proceedings pp. 43-54 (Jul. 19-24, 1998) (hereinafter "the Baraff reference"), the entirety of which is incorporated by reference herein.

In collision stage 530, the updated model is tested for potential collisions. As a result of computed contacts, the state of the scene is further modified. Collision detection is performed by checking whether pairs of points intersect. Collision detection techniques are well-known to persons skilled in the relevant arts. See, e.g., the Baraff reference at p. 50.

Physics pipeline 500 is exercised repeatedly across its stages for each of the simulation steps. In general, actors in the scene are considered either individually or on a group basis. Individual actors, as in the case of rigid bodies, pass through system setup stage 510 and solver stage 520 of pipeline 500 and only perform collision stage 530. Cloth, fluid and deformable entities in general are considered a collection of actors with an explicit interaction model. Hence, they are intended to execute all the stages of pipeline 500 in most cases. An example in which a cloth is passed through physics pipeline 500 is described herein in Section III.

B. An Example Physics Scene Description Language (FYSL)

Input abstraction to the FYSI physics simulation interface library is expressed in a custom scene description format, called FYSL. FYSL is expressed in an XML format and is composed of five sections: scene, simulation, actors, joints, and feedback. Each of these FYSL sections includes schema tags and optional value assignments. The schema tags and optional value assignments are described below. Samples of FYSL programs are provided at the end of this sub-section.

The first section of FYSL is the scene. In this section, the scene to be depicted is defined. Example global scene tags are presented in Table 1.

TABLE 1

Scene Tags

| Tag | type | options | comments |
| --- | --- | --- | --- |
| Name | string | any | scene |

The second section of FYSL is the simulation. The simulation process in FYSI is discrete and commences in steps. FYSL simulation properties include the type and the time interval between simulation steps.

In addition, global fields that represent forces operating identically on all scene actors can be optionally added to the simulation definition. In the present embodiment, FYSL provides three types of force field tags: a drag field, a directional field, and a procedural field. The drag field is a vector composed of three scalar values (one for each dimension) that exerts a braking force based on actor's linear velocity. The directional field is a unary force that is constant throughout the simulation and that operates in the direction specified by the vector. An example directional field is gravity. The procedural field represents a more involved field that might be varying in both time and space. The string attached to the procedural field is a function that is further translated into code of a shader program that executes on the GPU.

Example simulation tags are shown in Table 2 and example field tags are shown in Table 3.

TABLE 2

Simulation Tags

| tag | type | options | comments |
| --- | --- | --- | --- |
| Type | string | Collision response | collision detection determination collision detection and response |
| TimeStep | float | decimal | simulation step period (seconds) |
| Fields | | | defined in field tags table |

TABLE 3

Field Tags

| tag | type | options | comments |
| --- | --- | --- | --- |
| Drag | float | vector(3) | A drag force |
| Directional | float | vector(3) | a constant, directional force |
| Procedural | string | any | a procedural force description |

The third section of FYSL is actors. A group of actors is typically constructed in a logical grid that can be of one, two or three dimensions. The grid serves as means for deploying actors properties in GPU video memory. Grid tags include width, height and depth values as shown in Table 4.

TABLE 4

Grid Tags

| tag | Type | options | comments |
| --- | --- | --- | --- |
| Width | Integer | numeric | Grid width |
| Height | Integer | numeric | Grid height |
| Depth | Integer | numeric | Grid depth |

An actor is specified by global and specific shape and dynamics properties. Shapes are used to determine pair wise collision detection and dynamics properties facilitate physics behavior for resolving responses. FYSL and FYSI use a left handed coordinate system for the definition of shapes. Global actor tags include name, type and id values as shown in Table 5:

TABLE 5

Actor Tags

| tag | type | options | Comments |
| --- | --- | --- | --- |
| Name | string | any | actor name |
| Type | string | static dynamic kinematic | only considered in collision detection both in collision detection, response a dynamic actor w infinite mass |
| Id | integer | numeric | unique actor identification, positive |

Actor id (identification) is expected to be a positive integer, unique across a group of actors of the same hierarchy. For the most part FYSI is expected to assign default scene properties for those missing in the FYSL description.

Shape definitions supported in the described FYSL embodiment include box (axis aligned or oriented), sphere, mesh, and tetrahedron. Actor shape is defined in a local reference frame. Box and sphere bounding volumes are represented as a pair of center and radius (the latter is either a vector or a scalar, respectively). Mesh and tetrahedron assume a collection of vertex positions (for tetrahedron the number of vertices is fixed 4) and a set of face indices (implicit for a tetrahedron). For a mesh, faces are explicit; whereas for tetrahedron, faces are implicit. Shapes are associated with a matrix for specifying local frame to world coordinate space transformation (refer to the discussion below). Table 6 through Table 10 illustrate shape specific tags.

TABLE 6

Shape Tags - Common

| tag | type | options | comments |
| --- | --- | --- | --- |
| Transform | float | matrix(4) | local-to-world |

TABLE 7

Shape Tags - Box

| tag | type | options | comments |
| --- | --- | --- | --- |
| Position | float | vector(3) | box center |
| Radius | float | vector(3) | box half width, height and depth |

TABLE 8

Shape Tags - Sphere

| tag | type | Options | comments |
| --- | --- | --- | --- |
| Position | float | vector(3) | sphere center |
| Radius | float | Scalar | sphere radius |

TABLE 9

Shape Tags - Mesh

| Position | float | vector(3) | mesh vertex position |
| --- | --- | --- | --- |
| Face | int | vector(3) | mesh face indices |

TABLE 10

Shape Tags - Tetrahedron

| Position | float | vector(3) | Tetrahedron vertex position |
| --- | --- | --- | --- |

Center of mass for bounding volumes is explicit by the definition of the shape. For mesh and tetrahedron FYSI will implicitly compute a center of mass unless it is provided in the linear kinetics property set. Mesh center of mass parameter need not necessarily provided by the user, its presence though will override FYSI's internally computed one.

Simulation takes place in world coordinate space. Shape transform is a concatenation of translation and rotation components, the effect of applying linear and angular motion to an actor, respectively. The resultant matrix transforms a shape from local to world coordinate space. The transform matrix is used by a FYSI client for the visual rendering process.

A FYSL box shape may take inside FYSI either an axis aligned (AABB) or an oriented (OBB) computation path. The choice is rather dynamic and might vary from a simulation step to another e.g. based on contact response. In general, the AABB path for collision detection is more efficient compared to the OBB one.

Dynamics attributes can be of any combination of linear, angular and matter types. Dynamics attributes define kinematics properties that include mass, velocity, explicit center of mass position, orientation, and exerted forces. In addition, they provide contact response matter attributes, such as restitution and friction. Dynamics tags for linear, angular, and matter types are provided in Table 11, Table 12, and Table 13, respectively.

TABLE 11

Dynamic Tags - Linear

| tag | type | options | comments |
| --- | --- | --- | --- |
| Mass | float | scalar | mass property |
| Center | float | vector(3) | Center of mass position |
| Velocity | float | vector(3) | velocity property |
| Forces | defined | in | field tags table |

TABLE 12

Dynamic Tags - Angular

| tag | type | options | comments |
| --- | --- | --- | --- |
| Inertia | float | matrix(3) | mass distribution |
| Orientation | float | matrix(3) | body rotation |
| Omega | float | vector(3) | velocity property (radians/sec) |
| Torques | | | defined in field tags table |

TABLE 13

Dynamic Tags - Matter

| tag | type | options | comments |
| --- | --- | --- | --- |
| Restitution | float | scalar | measure of elasticity |
| StaticFriction | float | scalar | motion resistance from resting |
| DynamicFriction | float | scalar | motion resistance in motion |

A rigid body assumes a point mass for FYSI underlying performed physics behavioral rules. Linear motion and external forces operate on body's center of mass; angular motion is applied to the point of contact.

FYSL torques, when present, are applied to the vertices of any of a box or a mesh shape. Torques are also meaningful in the case of particles based actor, where each particle is defined as a sphere with a zero radius. The torque depends on the position relative to the center of mass of the actor (or a parent actor in the case of particles). The torque affects the resulting angular motion of the actor. FYSL torques is meaningful for a particle based actor (such as a shapeless actor without spatial extent). The torque depends on the particle position relative to the virtual center of mass of the top level actor. The torque affects angular motion of the particle.

Orientation for an actor is expected to be an orthogonal matrix where rows and columns are of unit length.

The omega dynamics property is a vector of angles in radians. A positive angle for any axis results in counter clockwise rotation around an axis; whereas, a negative angle results in clockwise rotation around the axis.

Mesh and tetrahedron face indices are zero based and each represent a triangle of a counterclockwise sense.

Grid deployment of actors takes advantage of GPU inherent data parallel architecture. The grid also provides the final image resolution to be read back from the physics assigned GPU for transporting simulation results onto the CPU or to a peer GPU that performs visual rendering. A 1D grid is highly inefficient on the GPU, and is usually not used. Usually, actors are distributed onto a 2D grid. The use of a 3D grid may be used, for example, if the 2D grid addressability exceeds the limits of the GPU. The dimensions of the grid not required to be a power-of-2. Finally, number of actors might not necessarily match the number of grid cells (e.g., the latter must be equal or greater than the number of actors in a hierarchy). As a result, a 2D grid might have the last row not fully populated, and the last slice of a 3D grid might not be fully inhabited. FYSI fills in any incurred sliver with dummy actors.

Actors may be made hierarchical and a collection of actors at each hierarchy level may share global attributes. A grid is expected to be attached to the collection of actors, at each level. Shapes at a higher hierarchy level are assumed to be of coarser geometry representation. This is in line with commencing top-down simulation, for which early collision detection rejection improves overall process efficiency. Also, dynamics properties of an actor can be made unique at each hierarchy level, providing the freedom to exercise adaptable physics. Joints (described hereafter) can be optionally applied to a group of actors for simulating constraints. For example, joints are used in the simulation of cloth as described in more detail in Section III below.

The fourth section of FYSL is joints. Joints define interaction constraints between a pair of actors. They essentially limit the movement of actors. Joints may have common parameters and/or unique parameters based on type. The common parameters include the joint type and a handle for each of the pair actor members. Joints are at the same tag level as actors in a FYSL description format. As such, they can be defined in both the top scene level and at any actor hierarchy. Example joint tags are provided in Table 14, Table 15, and Table 16.

TABLE 14

Joint Tags - Common

| tag | type | options | comments |
|---|---|---|---|
| Type | string | distance spring | distance joint tightness and damper |
| ActorPair | int | numeric | actor pair handless |

TABLE 15

Joint Tags - Distance

| tag | type | options | comments |
|---|---|---|---|
| MinDistance | float | scalar | minimum distance |
| MaxDistance | float | scalar | maximum distance |

TABLE 16

Joint Tags - Spring

| tag | type | options | comments |
|---|---|---|---|
| Action | string | stretch shear bend | spring action type |
| Rest Length | float | scalar | spring length at rest |
| Stiffness | float | scalar | relative position force constant |
| Damping | float | scalar | relative velocity force constant |

The fifth section of FYSL is feedback. The feedback section of a FYSL description is only provided by FYSI for the return path of simulation results. In a multi-step simulation session there is a feedback section per step. Example feedback tags are shown in Table 17.

TABLE 17

Feedback Tags

| tag | type | options | comments |
|---|---|---|---|
| Step | integer | numeric | simulation current step# |
| StepRate | float | decimal | simulation steps per second |
| NumStatic | integer | numeric | number static actors |
| NumDynamic | integer | numeric | number dynamic actors |
| NumKinematic | integer | numeric | number kinematic actors |
| NumCollisions | integer | numeric | number actor pair collisions |
| CollisionPair | string | any | actor handle pair |

While the exemplary embodiments may include the above tags, other tag types could be used in alternative embodiments. Sample #1. Provided below is an example section of code written in FYSL. This section of code depicts a collision detection physics simulation scene with a pair of mesh shaped actors with angular and linear dynamics, respectively.

```
<!-- fysl scene description -->
<Scene>
    <Name>mesh</Name>
    <Simulation>
        <Type>response</Type>
        <TimeStep>.005</TimeStep>
    </Simulation>
    <Actors>
        <Grid>
            <Width>2</Width>
            <Height>1</Height>
            <Depth>1</Depth>
        </Grid>
        <Actor>
            <Name>a0</Name>
            <Type>static</Type>
            <Id>0</Id>
            <Shape>
                <Mesh>
                    <Vertex>
                        <Position>-.5 -.5 .0</Position>
                        <Position>-.5 .5 .0</Position>
                        <Position>.5 -.5 .0</Position>
                        <Position>.5 .5 .0</Position>
```

```
            </Vertex>
            <Index>
                <Face>0 2 1</Face>
                <Face>1 2 3</Face>
            </Index>
        </Mesh>
    </Shape>
    <Dynamics>
        <Angular>
            <Inertia>
                10. 1. -2 1. .0 .0 .1 .3 .4
            </Inertia>
            <Orientation>
                1. .0 .0 .0 1. .0 .0 .0 1.
            </Orientation>
            <Omega>.0 0. 1.</Omega>
            <Torques>
                <Directional>1. .0 .0</Directional>
            </Torques>
        </Angular>
    </Dynamics>
</Actor>
<Actor>
    <Name>a1</Name>
    <Type>dynamic</Type>
    <Id>1</Id>
    <Shape>
        <Mesh>
            <Vertex>
                <Position>-.5 -.5 3.0</Position>
                <Position>-.5 .5 3.0</Position>
                <Position>.5 -.5 3.0</Position>
                <Position>.5 .5 3.0</Position>
            </Vertex>
            <Index>
                <Face>0 2 1</Face>
                <Face>1 2 3</Face>
            </Index>
        </Mesh>
    </Shape>
    <Dynamics>
        <Linear>
            <Mass>10.</Mass>
            <Position>.0 .0 3.</Position>
            <Velocity>.0 .0 -1.</Velocity>
            <Forces>
                <Directional>.0 .0 2.<Directional>
            </Forces>
        </Linear>
    </Dynamics>
</Actor>
</Actors>
<Feedback></Feedback>
</Scene>
```

Sample #2. Provided below is another section of example code written in FYSL. This section of code illustrates a two level hierarchy for particles based actor of a 2 by 2 grid layout. This is a basic structure for defining cloth and fluid entities:

```
<!-- fysl scene description -->
<Scene>
    <Name>cloth</Name>
    <Simulation>
        <Type>response</Type>
        <TimeStep>0.0166</TimeStep>
    </Simulation>
    <Actors>
        <Grid>
            <Width>1</Width>
            <Height>1</Height>
            <Depth>1</Depth>
        </Grid>
        <Actor>
            <Name>fabric</Name>
            <Type>dynamic</Type>
            <Id>0</Id>
            <Shape>
                <Sphere>
                    <Position>.0 .0 .0</Position>
                    <Radius>.0</Radius>
                </Sphere>
            </Shape>
            <Dynamics>
                <Linear>
                    <Mass>1.</Mass>
                    <Center>0.015 0.015 .0</Center>
                    <Velocity>.0 .0 .0</Velocity>
                    <Forces>
                        <Directional>.0 .0 .0</Directional>
                    </Forces>
                </Linear>
            </Dynamics>
            <!- 2 by 2 particles children -->
            <Actors>
                <Grid>
                    <Width>2</Width>
                    <Height>2</Height>
                    <Depth>1</Depth>
                </Grid>
                <Actor>
                    <Name>00</Name>
                    <Type>dynamic</Type>
                    <Id>0</Id>
                    <Shape>
                        <Sphere>
                            <Position>.0 .0 .0</Position>
                            <Radius>.0</Radius>
                        </Sphere>
                    </Shape>
                    <Dynamics>
                        <Linear>
                            <Mass>1.</Mass>
                            <Center>.0 .0 .0</Center>
                            <Velocity>.0 .0 .0</Velocity>
                            <Forces>
                                <Directional>.0 .0 .0</Directional>
                            </Forces>
                        </Linear>
                    </Dynamics>
                </Actor>
                <Actor>
                    <Name>01</Name>
                    <Type>dynamic</Type>
                    <Id>1</Id>
                    <Shape>
                        <Sphere>
                            <Position>.001 .0 .0</Position>
                            <Radius>.0</Radius>
                        </Sphere>
                    </Shape>
                    <Dynamics>
                        <Linear>
                            <Mass>1.</Mass>
                            <Center>.0 .0 .0</Center>
                            <Velocity>.0 .0 .0</Velocity>
                            <Forces>
                                <Directional>.0 .0 .0</Directional>
                            </Forces>
                        </Linear>
                    </Dynamics>
                </Actor>
                <Actor>
                    <Name>10</Name>
                    <Type>dynamic</Type>
                    <Id>2</Id>
                    <Shape>
                        <Sphere>
                            <Position>.0 0.01 .0</Position>
                            <Radius>.0</Radius>
                        </Sphere>
                    </Shape>
                    <Dynamics>
                        <Linear>
                            <Mass>1.</Mass>
```

```
                <Center>.0 .0 .0</Center>
                <Velocity>.0 .0 .0</Velocity>
                <Forces>
                    <Directional>.0 .0 .0</Directional>
                </Forces>
            </Linear>
        </Dynamics>
    </Actor>
    <Actor>
        <Name>11</Name>
        <Type>dynamic</Type>
        <Id>3</Id>
        <Shape>
            <Sphere>
                <Position>.01 0.01 .0</Position>
                <Radius>.0</Radius>
            </Sphere>
        </Shape>
        <Dynamics>
            <Linear>
                <Mass>1.</Mass>
                <Center>.0 .0 .0</Center>
                <Velocity>.0 .0 .0</Velocity>
                <Forces>
                    <Directional>.0 .0 .0</Directional>
                </Forces>
            </Linear>
        </Dynamics>
    </Actor>
    </Actors>
    </Actor>
  </Actors>
  </Feedback>
</Scene>
```

C. An Example Manner in which Physical Parameters Associated with a Mesh May be Received and Converted into FYSL Software dynamics solvers (such as Maya® Dynamics owned by Autodesk® of San Rafael, Calif.) exist for performing physics simulations that are executed by the CPU. In accordance with an embodiment of the present invention, a plug-in is used to by-pass such a software dynamics solver, and thereby perform physics simulations on the GPU(s) as described herein. In this embodiment, the plug-in captures a scene and converts attributes and fields associated with actors depicted in the scene into FYSL, so that physics simulations may be performed on the GPU(s) using FYSI. In another embodiment, a user may choose whether physics simulations are performed by the GPU(s) or by the software dynamics solver. In a further embodiment, the GPU(s) or the software solver is automatically selected to perform physics simulations based on a predetermined criterion, such as GPU availability and/or software support for a given feature. For example, the GPU(s) may be used to perform physics simulations of rigid bodies and cloth, but the software dynamics solver may be used to perform physics simulations of fluids. By allowing physics simulations to be performed by either the GPU(s) or the software dynamics solver, faster frame rates may be achieved. An example plug-in for by-passing a particular software dynamics solver (namely, Maya® Dynamics) is described in this section, but first an overview of Maya® Dynamics is provided.

Maya® Dynamics is a class of techniques that produce motion by simulating the physics of the real world. Dynamics in Maya® is diverse, powerful and owns a tool set positioned at an identical importance level with modeling, animation and rendering. In general, the Maya® Dynamics concept entails simulation based animation, without the use of key frames. The Maya® Dynamics family includes rigid and soft bodies, particle systems, cloth, fluid and hair members. Maya® Dynamics is used in games for creating visually impressive effects that are based on physical principals.

Figure 6:
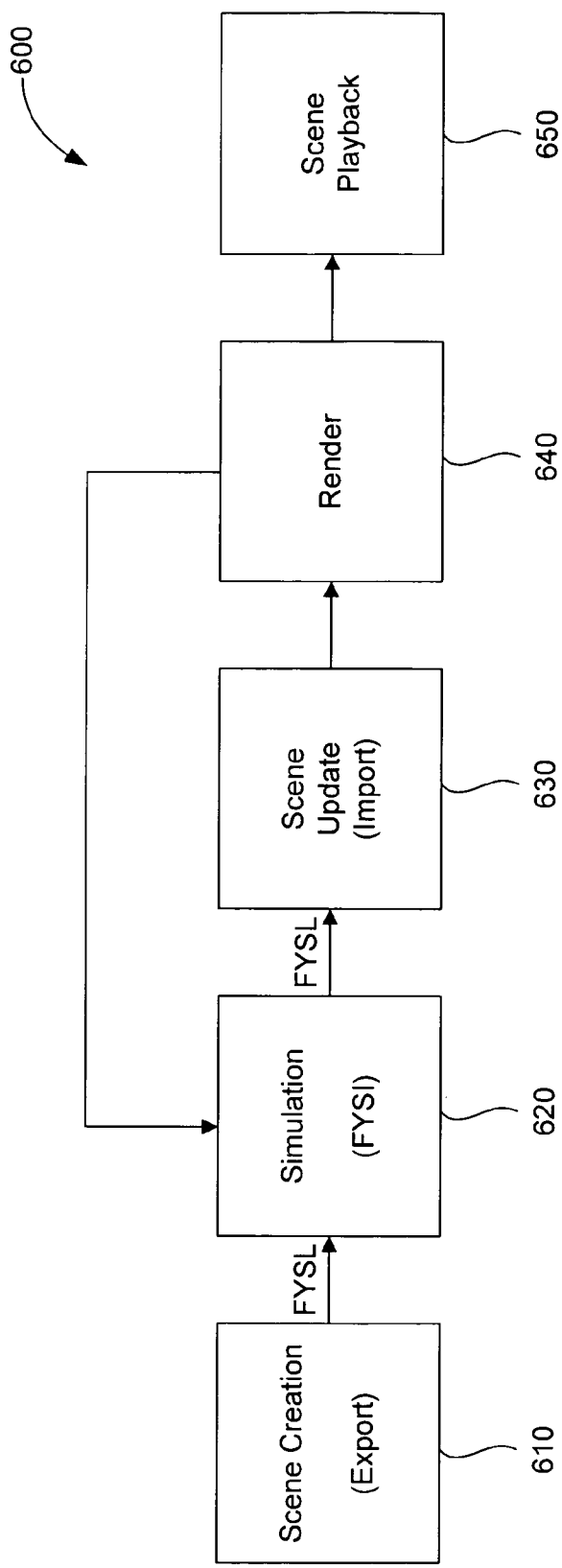
FIG. 6 depicts a block diagram of an example workflow for by-passing a software dynamics solver, and thereby performing physics simulations on a GPU in accordance with an embodiment of the present invention.

FIG. 6 depicts a block diagram depicting an example workflow 600 that utilizes the GPU(s) to achieve a higher simulation rate without compromising robustness as compared to software dynamics solver, such as Maya® Dynamics. The workflow is for the most part controlled by a plugin to Maya® Dynamics. Such a plugin includes a scene exporter, a GPU Dynamics simulator FYSI, and a scene importer.

Workflow 600 begins at a step 610 in which the scene exporter receives attributes and fields attached to scene objects by the artist. Attributes include initial velocity, spin, orientation, and matter friction. Fields represent forces that influence motion and involve drag, gravity or procedurally defined, with the latter expressed in a GPU shader program. The user either selects all or a subset of scene objects for commencing GPU based simulation. The exporter converts object geometry shapes and dynamics properties onto a GPU oriented physics simulation format, which in an embodiment is FYSL.

In a step 620, physics simulations are performed on the GPU(s) using FYSI. The GPU based simulator replaces the software dynamics solver node (such as Maya® Dynamics® integrated solver) seamlessly once the appropriate FYSI plugin is present. The GPU simulator runs simulation recursively in multiple discrete frames. In the course of simulation, the current scene state is resolved and collision detection amongst each pair of FYSL dynamic actors is sought. Colliding pairs are further processed to arrive at a contact response that is likely to affect the motion of an involved actor. FYSI GPU assisted physics simulation utilizes primarily the pixel engines that exploits a much higher degree of concurrency than the vertex processors. Physics simulation on the GPU is grid based where there are little or no communication barriers across lattice cells. Computational kernels involved have for the most part a high arithmetic intensity characteristic and are therefore favorable candidates for demonstrating improved speedup compared to an equivalent CPU implementation. The simulation process exploits the use of a single or multiple GPUs for enhanced efficiency, all transparent to the artist interacting with the software dynamics solver. FYSI produces results in an identical FYSL representation format to the one the exporter emitted. FYSI results are cached internally for a full simulation session and are fully exposed for reuse in Maya® Dynamics.

In a step 630, simulator results per frame are imported back onto the Maya® Dynamics scene graph. During step 630, only geometry shapes and transformation data are of concern. FYSI provides both shape positional and transformation updates for every simulation step. Transform data is relative to the incoming scene positions and orientations. In the case of rigid bodies, it suffices to update transformation scene graph nodes from Maya® Dynamics. For deformed bodies (such as cloth and fluid), updates are performed on full mesh vertices and indices in scene primitive nodes provided by Maya® Dynamics.

In a step 640, the simulation results are rendered for visualization. Either the GPU or a software based renderer is invoked to visualize the simulation effects. In an embodiment, the GPU for running the visual rendering task is physically apart from the GPU(s) performing physics simulation. This is again to facilitate parallelism at a higher level.

In a step 650, the rendered results are played back in a scene.

III. AN EXAMPLE METHOD FOR PERFORMING PHYSICS SIMULATIONS ON ONE OR MORE GPUS

A. Overview of Method

Figure 7:
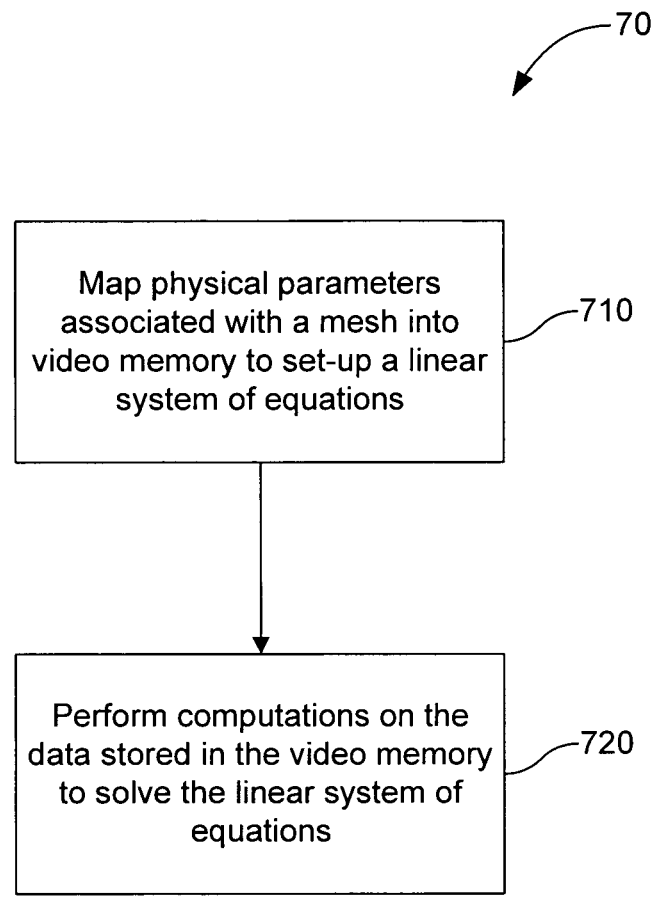
FIG. 7 depicts a block diagram illustrating an example method for performing physics simulations on a GPU in accordance with an embodiment of the present invention.

An example method for performing physics simulations on the GPU(s) using FYSI and FYSL is now described. FIG. 7 depicts a block diagram illustrating an example method 700 for performing game physics simulations on one or more GPUs in accordance with an embodiment of the present invention. Method 700 begins at a step 710 in which physical parameters associated with a mesh are mapped into video memory to set up a linear system of equations that governs motion of the mesh depicted in a scene. The video memory may comprise textures 310 described above with reference to FIG. 3. The mesh may represent any type of physical object, such as a solid object, a volume, a fluid, a cloth, or another type of physical object as would be apparent to a person skilled in the relevant art(s).

In a step 720, computations are performed on the data in video memory using at least one pixel processor to solve the linear system of equations for an instant of time. Modified data representing the solution to the linear system of equations for the instant of time are then stored in the video memory. In an embodiment, the modified data is stored in textures 310 and then another shader renders graphics corresponding to the modified data. In this embodiment, a single GPU performs the physics simulations and the rendering of graphics. In another embodiment, the modified data is provided as output of a first GPU and then written into the textures of a second GPU. In this embodiment, the first GPU performs the physics simulations and the second GPU performs the rendering of graphics. Alternatively, the first GPU could write the modified data to an area of memory accessible to the second GPU (e.g., video memory of the first GPU or system memory).

Method 700 may be implemented to simulate any type of physical object. Provided below is an example implementation for simulating cloth on one or more GPUs. This example implementation is provided for illustrative purposes only, and not limitation. Based on the description contained herein, a person skilled in the relevant art(s) will understand how to perform simulations of other types of physical objects on the GPU.

An implicit technique for simulating cloth on one or more GPUs is now described. First, a physical model of cloth and two approaches to simulating that model in discrete time are presented. Second, a three-step process of an implicit discrete time-simulation is described. Third, a method for mapping this three-step process onto the GPU(s) is presented.

B. An Example Physical Model for Cloth Simulation

Figure 8:
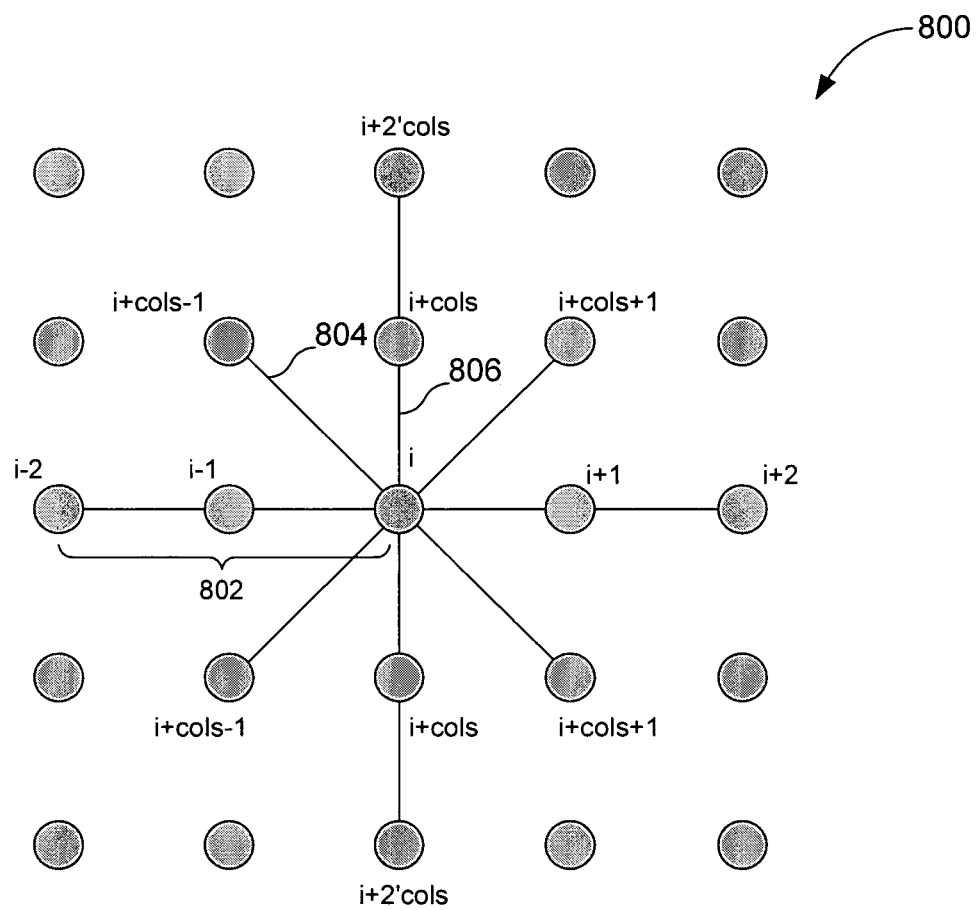
FIG. 8 depicts an example point-mesh for modeling cloth in accordance with an embodiment of the present invention.

Cloth may be simulated by an internally constrained particle system. Such an internally constrained particle system may be represented as an array of point masses subject to internal stretch and dampening forces. These forces are dependent on the relative displacement and velocity of neighboring points. Such an array of point masses is referred to herein as a point-mesh. FIG. 8 depicts an example point-mesh 800.

Given point-mesh 800, the following physical parameters associated with point-mesh 800 may be defined:

$x_i \in \mathfrak{R}^3$ the position in world space of the i th particle;

$\vec{x} \in \mathfrak{R}^{3n}$ the geometric state of all particles in a block vector;

$f_i \in \mathfrak{R}^3$ the net force acting on the i th particle;

$\vec{f}_i \in \mathfrak{R}^3$ the block vector of the net forces acting all particles; and $M \in \mathfrak{R}^{3n \times 3n}$ the "Diagonal Mass Matrix" defined by $diag(M) = \{\{m_1 m_1 m_1\}\{m_2 m_2 m_2\} \ldots \{m_n m_n m_n\}\}$ where $m_i$ is the mass of the i th particle. Alternatively, M may be interpreted blockwise, that is as an $\{n \times n\}$ diagonal matrix with each element being a $\{3 \times 3\}$ diagonal matrix.

Newton's Second Law (i.e., F=ma) may be written for point-mesh 800 as follows: or $$\vec{f}_i = M \cdot \ddot{\vec{x}} \qquad (Eq.\ 1)$$
$$\ddot{\vec{x}} = M^{-1} \cdot \vec{f}.$$

or

For a second order mass-spring system with linear dampeners, the net force acting on particle i is a function of relative position, $\vec{x}$, and velocity of all (typically neighboring) particles, $$\dot{\vec{x}}.$$

Thus, each component of the net force in Eq. 1 may be written as $$\begin{cases} \frac{\delta}{\delta t}\vec{x} = \dot{\vec{x}} \\ \frac{\delta}{\delta t}\dot{\vec{x}} = M^{-1} \cdot \vec{f}(\vec{x}, \dot{\vec{x}}) \end{cases} \qquad (Eq.\ 2)$$

It follows that the motion of point-mesh 800 is governed by:

$$f_i = f_i(\vec{x}, \dot{\vec{x}}).$$

Thus, the solution of Eq. 2 may be used to simulate the motion of point-mesh 800.

In order for Eq. 2 to be solved by a sequence of computer process (e.g., processes performed by at least one pixel processor in a GPU), Eq. 2 must be converted into a discrete-time problem. In a discrete-time problem, a next state of a system is given by its previous state(s). Specifically, given the position and velocity of a system at time $t_k$ (i.e., given $\vec{x}^k = \vec{x}(t_k)$ and $$\dot{\vec{x}}^k = \dot{\vec{x}}(t_k)),$$

the simplest first-order discrete-time problem is to determine the position and velocity of the system at time $t_{k+1}$ (i.e., determine $\vec{x}^{k+1} = \vec{x}(t_{k+1})$ and $$\dot{\vec{x}}^{k+1} = \dot{\vec{x}}(t_{k+1})),$$

wherein $t_{k+1} = t_k + \Delta t$. The solution to the discrete-time problem involves discrete-time integration. There exist at least two general classes of discrete-time integration—namely, explicit methods and implicit methods.

Explicit methods compute the state at a next time step out of a direct extrapolation of previous states using the forward projection of derivatives. For example, the first-order Euler Forward Difference approximates $$\frac{\delta}{\delta t} a = b \rightarrow \frac{a^{k+1} - a^k}{\Delta t} = b^k.$$

Note that the right-hand-side of the discrete time-derivative is bound on the left-hand-side by a value in the previous time-step. It follows that the future state may be rewritten as a function of state, namely $$a^{k+1} = a^k + b^k \cdot \Delta t \quad \text{(Eq. 3)}.$$

Applying the form of Eq. 3 to point-mesh 800, the system of equations that governs motion of point-mesh 800 (i.e., Eq. 2) may be rewritten as a set of simple independent update equations applied per time-step, given by $$\left\{ \begin{array}{c} \frac{\delta}{\delta t}\vec{x} = \dot{\vec{x}} \\ \frac{\delta}{\delta t}\dot{\vec{x}} = M^{-1} \cdot \vec{f}(\vec{x}, \dot{\vec{x}}) \end{array} \right\} \rightarrow \left\{ \begin{array}{c} \vec{x}^{k+1} = \vec{x}^k + \dot{\vec{x}}^k \cdot \Delta t \\ \dot{\vec{x}}^{k+1} = \dot{\vec{x}}^k + M^{-1} \cdot \vec{f}(\vec{x}^k, \dot{\vec{x}}^k) \cdot \Delta t \end{array} \right\}. \quad \text{(Eq. 4)}$$

The primary draw-back to explicit integration schemes is numerical stability. In general for the forward approximation to hold, the function a(t) in Eq. 3 must not change too rapidly with respect to $\Delta t$. That is, the product ($b^k \cdot \Delta t$) must be below a threshold. When $b^k$ is large, the system is termed "stiff" and $\Delta t$ must be made proportionally small.

Implicit methods account for the second class of discrete-time integration techniques. Implicit methods deduce the state at a next time step from a system of equations expressing some "reversibility" from the extrapolated results. In other words, the backward derivatives of future state are simultaneously verified against previous state. For example, the first-order Euler Backward Difference approximates $$\frac{\delta}{\delta t} a = b \rightarrow \frac{a^{k+1} - a^k}{\Delta t} = b^{k+1}.$$

The subtlety is that the right-hand-side of the discrete-time derivative is now simultaneously bound on the left-hand-side by a value in the future. As a direct consequence, a future-state cannot be expressed as a simple function of previous-state(s).

Applied to point-mesh 800, the system's governing equations (i.e., Eq. 2) reduce to a simultaneous system of 3n unknowns $$\left\{ \vec{x}^{k+1} \in R^{3n} \mid \vec{x}^k \wedge \dot{\vec{x}}^k \in R^{3n} \right\}$$

that must be solved at every time-step:

$$\left\{ \begin{array}{c} \frac{\delta}{\delta t}\vec{x} = \dot{\vec{x}} \\ \frac{\delta}{\delta t}\dot{\vec{x}} = M^{-1} \cdot \vec{f}(\vec{x}, \dot{\vec{x}}) \end{array} \right\} \rightarrow \quad \text{(Eq. 5)}$$

$$\left\{ \begin{array}{c} \vec{x}^{k+1} = \vec{x}^k + \dot{\vec{x}}^k \cdot \Delta t \\ \dot{\vec{x}}^{k+1} = \dot{\vec{x}}^k + M^{-1} \cdot \vec{f}(\vec{x}^{k+1}, \dot{\vec{x}}^{k+1}) \cdot \Delta t \end{array} \right\}.$$

The task may seem daunting but the approach has two significant advantages. First, implicit techniques are almost unconditionally stable—meaning they are less susceptible to the characteristically "stiff" equations of realistic cloth simulation, and are thus capable of supporting much larger time-steps. Second, resulting systems tend to be sparse and symmetric and these types of systems are readily solved with efficient numerical methods.

In either the explicit integration method represented in Eq. 4 or the implicit integration method represented in Eq. 5, the net internal force vector $\vec{f}$ must be evaluated. In general, $$f(\vec{x}, \dot{\vec{x}})$$

is a non-linear function that models the internal constraints of cloth. In discrete time, $$f(\vec{x}, \dot{\vec{x}})$$

is always a function of present state (i.e., $$\vec{f}^k = \vec{f}(\vec{x}^k, \dot{\vec{x}}^k)).$$

With explicit integration $\vec{f}^k$ is evaluated directly to update $$\vec{x}^{k+1}.$$

Specifically, as shown in Eq. 4, $$\dot{\vec{x}}^{k+1} = \dot{\vec{x}}^k + M^{-1} \cdot \vec{f}^k(\vec{x}^k, \dot{\vec{x}}^k) \Delta t.$$

However, to ensure stability $\Delta t$ must be chosen to reflect the "stiffness" of $\vec{f}^k$. Unfortunately, realistic internal forces are relatively stiff and necessitate proportionally small time-steps. As demonstrated by the aforementioned Baraff reference, the cumulative cost of many updates at these small time-steps, required for realistically stiff equations, eventually outweighs the cost of solving a large-sparse linear-system at a coarser time-step. See David Baraff and Andrew Witkin, "Large Steps in Cloth Simulation," In Proceedings of SIGGRAPH 98, pp. 43-54 (1998). Consequently, the implicit approach has dominated realistic cloth simulation.

The implicit integration technique is not without its share of complications. In particular, the implicit integration technique requires an expression for $\vec{f}^{k+1}$, not $\vec{f}^k$. In this case, an approximate is used. Specifically, $$\vec{f}^{k+1} = \vec{f}(\vec{x}^{k+1}, \dot{\vec{x}}^{k+1})$$

is approximated by its first-order Taylor expansion $$\vec{f}^{k+1} = \vec{f} + (\vec{x}^{k+1} - \vec{x}^k) \cdot \frac{\partial \vec{f}}{\partial \vec{x}}\bigg|_{\{\vec{x}^k, \dot{\vec{x}}^k\}} + (\dot{\vec{x}}^{k+1} - \dot{\vec{x}}^k) \cdot \frac{\partial \vec{f}}{\partial \dot{\vec{x}}}\bigg|_{\{\vec{x}^k, \dot{\vec{x}}^k\}}. \quad \text{(Eq. 6)}$$

The first term in Eq. 6 is evaluated as in the explicit case, whereas the second and third terms are dependent on Jacobean matrices, $\partial \vec{f}/\partial \vec{x}$ and $$\partial \vec{f}/\partial \dot{\vec{x}},$$

evaluated at the last time-step. Though independent of external forces, these Jacobean matrices are large and relatively difficult to evaluate. They are in fact {n×n} matrices of {3×3} sub-matrix elements.

A Jacobean matrix has the form $$\frac{\partial \vec{f}}{\partial \vec{x}} = \begin{bmatrix} \frac{\partial f_1}{\partial x_1} & \cdots & \frac{\partial f_1}{\partial f_n} \\ \vdots & \frac{\partial f_i}{\partial x_j} & \vdots \\ \frac{\partial f_n}{\partial x_1} & \cdots & \frac{\partial f_n}{\partial x_n} \end{bmatrix}. \quad \text{(Eq. 7)}$$

Since $\{f_i, x_j, \dot{x}_j\} \in \Re^3$, the elements of $\partial f_i/\partial x_j$ and $\partial f_i/\partial \dot{x}_j$ are themselves given by {3×3} Jacobean matrices of the form $$\frac{\partial f_i}{\partial x_j} = \begin{bmatrix} \frac{\partial f_i^X}{\partial x_i^X} & \frac{\partial f_i^X}{\partial f_i^Y} & \frac{\partial f_i^X}{\partial f_n} \\ \frac{\partial f_i^Y}{\partial f_i^X} & \frac{\partial f_i^Y}{\partial x_i^Y} & \frac{\partial f_i^Y}{\partial x_i^Z} \\ \frac{\partial f_i^Z}{\partial x_i^X} & \frac{\partial f_i^Z}{\partial x_i^Y} & \frac{\partial f_i^Z}{\partial x_i^Z} \end{bmatrix}$$

Supposing $\partial \vec{f}/\partial \vec{x}$ and $$\partial \vec{f}/\partial \dot{\vec{x}}$$

can be evaluated, the linear systems that need to solve per time-step (i.e., Eq. 5) can be rewritten in terms of $$\dot{\vec{x}}^{k+1}$$

as follows:

$$\left(I - \Delta t \cdot M^{-1} \cdot \frac{\partial \vec{f}}{\partial \dot{\vec{x}}}\bigg|_k - \Delta t^2 \cdot M^{-1} \cdot \frac{\partial \vec{f}}{\partial \vec{x}}\bigg|_k\right) \cdot (\dot{\vec{x}}^{k+1} - \dot{\vec{x}}^k) = \quad \text{(Eq. 8)}$$

$$\Delta t \cdot M^{-1} \cdot \left(\vec{f}^k + \Delta t \cdot \frac{\partial \vec{f}}{\partial \vec{x}}\bigg|_k \cdot \dot{\vec{x}}^k\right)$$

wherein I is an identity matrix, M is a diagonal matrix of masses of the mesh, $\vec{x}^k$ is a vector representing a geometric state of the mesh at time $$t_k, \dot{\vec{x}}^k$$

is a vector representing a velocity of each point in the mesh at time $t_k$, and $$\vec{f}(\vec{x}^k, \dot{\vec{x}}^k)$$

is a vector representing a net force on each point of the mesh at time $t_k$. Thus, an implicit integration method for performing physics simulations of point-mesh 800 is to solve Eq. 8 for each time step $\Delta t$.

Eq. 8 may be written as $A\vec{x} = \vec{b}$, wherein:

$$A = \left(I - \Delta t \cdot M^{-1} \cdot \frac{\partial \vec{f}}{\partial \dot{\vec{x}}}\bigg|_k - \Delta t^2 \cdot M^{-1} \cdot \frac{\partial \vec{f}}{\partial \vec{x}}\bigg|_k\right); \quad \text{(Eq. 9a)}$$

$$\vec{x} = (\dot{\vec{x}}^{k+1} - \dot{\vec{x}}^k); \text{ and} \quad \text{(Eq. 9b)}$$

$$b = \Delta t \cdot M^{-1} \cdot \left(\vec{f}^k + \Delta t \cdot \frac{\partial \vec{f}}{\partial \vec{x}}\bigg|_k \cdot \dot{\vec{x}}^k\right). \quad \text{(Eq. 9c)}$$

As set forth above with reference to FIG. 5, performing physics simulations on a GPU using FYSI includes three steps: (i) a system setup step; (ii) a solver step; and (iii) a collision step.

The system setup step involves determining values for $\{A, \vec{x}, \vec{b}\}$ in $A\vec{x} = \vec{b}$, given a constant timestep $\Delta t$, the diagonal mass matrix M, and the present positions $\vec{x}^k$ and velocities of the point-mesh $$\dot{\vec{x}}^k.$$

From these inputs, intermediate values for $$\{\vec{f}, \partial \vec{f}/\partial \vec{x}, \partial \vec{f}/\partial \dot{\vec{x}}\}$$

are evaluated which relate to $\{A, \vec{x}, \vec{b}\}$ given by Eq. 9. The remainder of this subsection details the evaluation of these intermediate values.

A linear pair-wise force model for rectangular point-mesh 800 is used. In the linear pair-wise force model for point-mesh 800, an edge between points i and j is called a joint, and represents a combined spring and dampener. Two joints are complimentary if ij=ji, in which case equal but opposite forces (i.e., Newton's Third Law) are applied to vertices i and j, given by $f_{ij}$ and $f_{ij}=-f_{ij}$, respectively. If a joint is not defined between vertices i and j, or if i=j, it is evident that $f_{ij}=0$. Finally, an expression for the net internal force acting on the ith point and its Jacobeans with respect to $\vec{x}$ and $$\dot{\vec{x}}$$

is then given by $$f_i = \sum_{k}^{k \neq 1} f_{ik}$$

$$\frac{\partial f_i}{\partial x_j} = \sum_{k}^{k \neq 1} \frac{\partial f_{ik}}{\partial x_j}$$

$$\frac{\partial f_i}{\partial \dot{x}_j} = \sum_{k}^{k \neq 1} \frac{\partial f_{ik}}{\partial \dot{x}_j}$$

In practice, joints are only defined between neighboring points and exist in a regular pattern. For instance, the joint topology shown in point-mesh 800 of FIG. 8 includes up to 12 joints per point (subject to boundary conditions).

Since per joint forces are only dependent on their vertices, it can be shown that rows $\partial f_i / \partial \vec{x}$ and $$\frac{\partial f_i}{\partial \dot{\vec{x}}}$$

are sparse. That is, given $\partial \vec{f}_{ik}/\partial \vec{x}_j = 0$, if $j \neq i$ and $j \neq k$ the expressions for off-diagonal elements (i.e. $j \neq i$) of $\partial \vec{f}/\partial \vec{x}$ and $\partial \vec{f}/\partial \dot{\vec{x}}$ reduce to $$\frac{\partial f_i}{\partial x_j} = \frac{\partial f_{ij}}{\partial x_j}$$

$$\frac{\partial f_i}{\partial \dot{x}_j} = \frac{\partial f_{ij}}{\partial \dot{x}_j}$$

On the diagonal (i.e., $j=i$), the original expressions for $\partial f_i/\partial x_j = \partial f_i/\partial x_i$ and $\partial f_i/\partial \dot{x}_j = \partial f_i/\partial \dot{x}_i$ hold, and the elements are non-zero provided just one joint exists for point i. Therefore, since off-diagonal $\partial f_i/\partial x_j = 0$ and $\partial f_i/\partial \dot{x}_j = 0$ when ij is not a joint, $$\frac{\partial f_i}{\partial \dot{\vec{x}}}$$

can only have as many non-zero elements as one plus the number of joints defined for point i. For instance, for the joint-topology shown in FIG. 8, irrespective of point-mesh dimensions, the resulting Jacobeans will have at most 13 (=1+12 joints per point) non-zero elements.

In order for the linear system of equations governing the motion of point-mesh 800 to represent a "well-formed" system, matrix A must be (i) sparse and (ii) symmetric. With respect to item (i), A is sparse because A is linearly dependent on the Jacobean matrices $\partial \vec{f}/\partial \vec{x}$ and $$\partial \vec{f}/\partial \dot{\vec{x}},$$

and each of these Jacobean matrices has been demonstrated to be sparse. With respect to item (ii), it is noted that the Jacobeans $\partial \vec{f}/\partial \vec{x}$ and $$\frac{\partial \vec{f}}{\partial \dot{\vec{x}}}$$

are themselves symmetric provided the following can be enforced off-diagonal $$\frac{\partial f_{ji}}{\partial x_j} = -\frac{\partial f_{ij}}{\partial x_i} = \frac{\partial f_{ij}}{\partial x_j} \rightarrow \frac{\partial f_j}{\partial x_i} = \frac{\partial f_i}{\partial x_j} \quad \text{(Eq. 10)}$$

$$\frac{\partial f_{ji}}{\partial \dot{x}_j} = -\frac{\partial f_{ij}}{\partial \dot{x}_i} = \frac{\partial f_{ij}}{\partial \dot{x}_j} \rightarrow \frac{\partial f_j}{\partial \dot{x}_i} = \frac{\partial f_i}{\partial \dot{x}_j}.$$

Thus, if Eq. 10 holds, A is both sparse and symmetric, and therefore the linear system of equations is efficiently solvable. The criteria that both $\partial f_{ij}/\partial x_j = -\partial f_{ij}/\partial x_i$ and $\partial f_{ij}/\partial \dot{x}_j = -\partial_{ij}/\partial \dot{x}_i$ will be shown to be a guiding factor in certain physical assumptions.

Referring to FIG. 8, joint forces between points in point-mesh 800 may be grouped into three classes: (i) stretch joints 806; (ii) shear joints 804; and (iii) bend joints 802. Defined between adjacent nodes, stretch joints 806 model the strongest of the internal forces. Stretch joints 806 resist in-plane changes in area. Defined between diagonal nodes, shear joints 804 model the second strongest internal force. Shear joints 804 resist the tendency for cloth to pinch inwards when pulled at the corners. Finally, defined between alternating nodes, bend joints 802 model the weakest internal force. Bend joints 802 resist folding.

While more realistic definitions have been defined, the pair-wise per joint force model presented above is influenced by a mix of the aforementioned Baraff reference and a pair-wise joint force model taught by Kwang-Jin Choi and Hyeong-Seok Ko, "Stable but Responsive Cloth," In ACM Transactions on Graphics, SIGGRAPH 2002, pp. 604-11 (2002), the entirety of which is incorporated by reference herein. According to the model disclosed herein, all joints are modeled by the same function, but classes of joints (i.e., stretch, shear, and bend) can be globally parameterized with different values for a stiffness $k_s$, a dampening $k_d$, and a natural length L. Per joint, the action of the spring (parameterized by $k_s$ and L) and dampener (parameterized by $k_d$) are linearly independent and can be considered separately.

In general, the per joint force $f_{ij}$ for either a spring force or a damping force will satisfy two properties: (i) the per joint force $f_{ij}$ will act along the direction of the joint $\vec{r}_{ij}$; and (ii) the per joint force $f_{ij}$ will be proportional to a condition function $C(x_{ij}, \dot{x}_{ij})$. These two properties may be written mathematically as follows:
given $$x_{ij} \in \mathbb{R}^3 | x_{ij} = x_j - x_i;$$

$$\hat{r}_{ij} \in \mathbb{R}^3 | \hat{r}_{ij} = \hat{r}(x_{ij}) = \frac{x_{ij}}{|x_{ij}|}; \text{ and}$$

$$C(x_{ij}, \dot{x}_{ij}) \in \mathbb{R};$$

then $$f_{ij} = C(x_{ij}, \dot{x}_{ij}) \cdot \hat{r}_{ij};$$

$$\frac{\partial f_{ij}}{\partial x_j} = \left( \frac{(C(x_{ij}, \dot{x}_{ij}))}{\partial x_j} \cdot \hat{r}_{ij}^T + C(x_{ij}, \dot{x}_{ij}) \cdot \frac{\partial \hat{r}_{ij}}{\partial x_j} \right); \text{ and}$$

-continued $$\frac{\partial f_{ij}}{\partial \dot{x}_j} = \left(\frac{(\partial C(x_{ij}, \dot{x}_{ij}))}{\partial x_j} \cdot \hat{r}_{ij}^T\right),$$

wherein $$\frac{\partial \hat{r}_{ij}}{\partial x_j} = \frac{\partial \hat{r}(x_{ij})}{\partial x_j} = \frac{I}{|x_{ij}|} - \frac{x_{ij}x_{ij}^T}{|x_{ij}|^3} = \frac{(I - \hat{r}_{ij}\hat{r}_{ij}^T)}{|x_{ij}|}, \text{ and}$$

$$\frac{\partial \hat{r}_{ij}}{\partial x_j} = \frac{\partial \hat{r}(x_{ij})}{\partial x_j}.$$

Since $\partial \vec{r}_{ij}/\partial x_i = -\partial \vec{r}_{ij}/\partial x_j$, the criteria for symmetry (i.e., $\partial f_{ij}/\partial x_j = -\partial f_{ij}/\partial x_i$ and $\partial f_{ij}/\partial \dot{x}_j = -\partial f_{ij}/\partial \dot{x}_i$) only requires the following to be enforced for $C(x_{ij}, \dot{x}_{ij})$:

$$\left(\frac{(\partial C(x_{ij}, \dot{x}_{ij}))}{\partial x_j} = \frac{(\partial C(x_{ij}, \dot{x}_{ij}))}{\partial x_j}\right); \text{ and}$$

$$\left(\frac{(\partial C(x_{ij}, \dot{x}_{ij}))}{\partial \dot{x}_j} = \frac{(\partial C(x_{ij}, \dot{x}_{ij}))}{\partial \dot{x}_j}\right).$$

The spring component of the per joint force $f_{ij}$ is now described. An ideal linear translational spring is a reactive mechanical device that resists and stores energy during deformation, and that exhibits a restitutive force acting to release stored energy. "Translational" refers to type of mechanical forces involved. In the model for cloth simulation described herein, forces act along the direction of joints (i.e., $\hat{r}_{ij}$). "Linear" refers to a restitutive force being directly proportional to deformation (i.e., change in x). Finally, "ideal" means that no energy is lost between cycles of deformation and restitution.

A per joint spring condition function is defined that directly conforms to the canonical ideal linear translational spring (i.e., $f = k \cdot \Delta x$). $C_s(x_{ij})$ depends only on present vertex positions, satisfies the symmetry criteria for both $\partial \vec{f}/\partial \vec{x}$ and $$\frac{\partial \vec{f}_i}{\partial \dot{\vec{x}}},$$

and is parameterized by a stiffness coefficient $k_s$ and natural length L given by the following equations:

$$C_s(x_{ij}) = k_s(|x_{ij}| - L);$$

$$\frac{\partial C_s(x_{ij})}{\partial x_j} = k_s \cdot \hat{r}_{ij};$$

$$\frac{\partial C_s(x_{ij})}{\partial x_j} = -\frac{\partial C_s(x_{ij})}{\partial x_j};$$

$$\frac{\partial C_s(x_{ij})}{\partial \dot{x}_j} = \frac{\partial C_s(x_{ij})}{\partial \dot{x}_j} = 0; \text{ and}$$

$$\frac{\partial f_{ij}}{\partial \dot{x}_j} = 0.$$

The damping component of the per joint force $f_{ij}$ is now described. A damper is a passive mechanical device that resists deformation, but in contrast to a spring does not store energy or exhibit a restitutive force. Instead, dampers resist deformation by dissipating applied energy in the form of heat. This characteristic is produced by a purely resistive force proportional to changes in velocity.

In the model for simulating cloth described herein, ideal linear translational dampers exhibit a resistive force along the direction of a joint $\hat{r}_{ij}$, which is directly proportional to relative changes in velocity of its vertices $\dot{x}_{ij}$. More specifically, it exhibits a resistive force proportional to relative changes in velocity in the direction of the joint (i.e., $\hat{r}_{ij}^T \dot{x}_{ij}$). A per joint damper condition function $C_d(x_{ij}, \dot{x}_{ij})$ parameterized by a dampening coefficient $k_d$ is defined. This per joint damper condition function satisfies the symmetry criteria for both $\partial \vec{f}/\partial \vec{x}$ and $$\partial \vec{f} / \partial \dot{\vec{x}}.$$

This statements may be represented mathematically as follows:

given $C_d(x_{ij}, \dot{x}_{ij}) = -k_d(\hat{r}_{ij}^T \dot{x}_{ij})$ wherein $$\frac{\partial C_d(x_{ij}, \dot{x}_{ij})}{\partial x_j} = -k_d\left(\frac{\dot{x}_{ij}}{|x_{ij}|} - \frac{x_{ij}^T \dot{x}_{ij}}{|x_{ij}|^3} \cdot x_{ij}\right) = -\frac{k_d}{|x_{ij}|}\left(\dot{x}_{ij} - \hat{r}_{ij}^T \dot{x}_{ij} \cdot \hat{r}_{ij}\right);$$

$$\frac{\partial C_d(x_{ij}, \dot{x}_{ij})}{\partial x_j} = \frac{\partial C_d(x_{ij}, \dot{x}_{ij})}{\partial x_j};$$

$$\frac{\partial C_d(x_{ij}, \dot{x}_{ij})}{\partial \dot{x}_j} = -k_d \hat{r}_{ij}; \text{ and}$$

$$\frac{\partial C_d(x_{ij}, \dot{x}_{ij})}{\partial \dot{x}_j} = \frac{\partial C_d(x_{ij}, \dot{x}_{ij})}{\partial \dot{x}_j};$$

then $$f_{ij} = -k_d(\hat{r}_{ij}^T \dot{x}_{ij}) \cdot \hat{r}_{ij};$$

$$\frac{\partial f_{ij}}{\partial x_j} = -k_d\left(\frac{\dot{x}_{ij}}{|x_{ij}|} - \frac{x_{ij}^T \dot{x}_{ij}}{|x_{ij}|^3} \cdot x_{ij}\right) = -\frac{k_d}{|x_{ij}|}\left(\dot{x}_{ij} - \hat{r}_{ij}^T \dot{x}_{ij} \cdot \hat{r}_{ij}\right); \text{ and}$$

$$\frac{\partial f_{ij}}{\partial \dot{x}_j} = -k_d(\hat{r}_{ij} \hat{r}_{ij}^T).$$

Response and effect of external forces on point-mesh 800 is now described. Examples of external forces include gravity, wind, and collisions (both self and with the environment). Note that a clear distinction exists between the response and effect of external forces. Responses involve an immediate change to a present state (i.e., position $\vec{x}^k$, velocity $$\dot{\vec{x}}^k,$$

and force $\vec{f}^k$). As such, responses are relatively easy to model. In contrast, the effect of a force constrains a future state (i.e., limit the future degrees of freedom because the fabric is pinned-down). As such, effects are relatively difficult to model.

Several approaches for solving for the response and effect of external forces are known, including approaches that use reduced coordinates, penalty methods, and/or Lagrange multipliers. See, e.g., the aforementioned Baraff reference. Another approach discussed in the Baraff reference places constraints on the mass of certain points in a point-mesh being modeled. As set forth above, the block-wise interpretation of the Diagonal Mass Matrix $M \in \mathfrak{R}^{3n \times 3n}$ represents the mass of the i th particle as a $\{3 \times 3\}$ diagonal matrix:

$$M_{ii} = -\begin{pmatrix} m_i & 0 & 0 \\ 0 & m_i & 0 \\ 0 & 0 & m_i \end{pmatrix}. \quad \text{(Eq. 11)}$$

If, however, it is assumed that the mass is an anisotropic mass and varies with direction, Eq. 11 may be rewritten as follows:

$$M_{ii} = -\begin{pmatrix} m_i & 0 & 0 \\ 0 & m_i & 0 \\ 0 & 0 & \infty \end{pmatrix}. \quad \text{(Eq. 12)}$$

Based on the mass matrix given in Eq. 12, the equation of motion for the point-mesh becomes $$\ddot{x}_i = \begin{pmatrix} 1/m_i & 0 & 0 \\ 0 & 1/m_i & 0 \\ 0 & 0 & 0 \end{pmatrix} \cdot f_i.$$

Thus, defining an anisotropic mass effectively constrains the effect of $f_i$ to the xy-plane; no acceleration is possible in the z-direction.

The approach developed in the Baraff reference has implications on the symmetry, and consequently the efficient solvability, of the linear system. These issues may be resolved by using a Modified Conjugate Gradient ("modified-CG") Method that introduces a filtering operation for enforcing the mass-based constraints. Another approach uses both mass based constraints and the modified-CG method, as described in Kwang-Jin Choi and Hyeong-Seok Ko, "Stable but Responsive Cloth," In ACM Transactions on Graphics, SIG-GRAPH 2002, pp. 604-11 (2002), the entirety of which is incorporated by reference herein.

C. An Example Implementation for Simulating Cloth on a GPU

Figure 9:
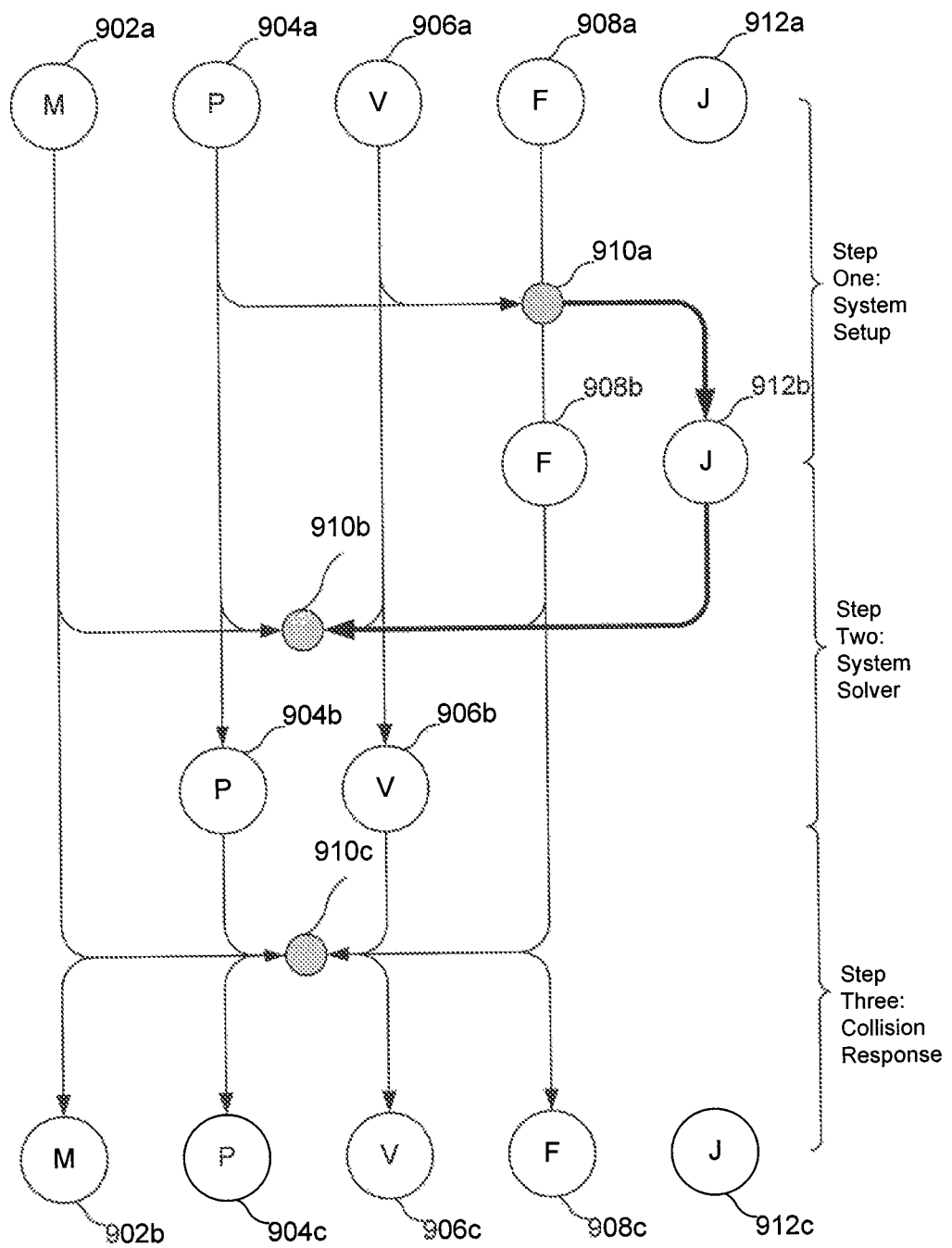
FIG. 9 depicts an example high-level flow diagram for simulating physics on a GPU in accordance with an embodiment of the present invention.

Having described a model for implicitly simulating cloth, a three-step method for implementing a simulation of cloth for each discrete time-step on a GPU is now described. FIG. 9 depicts an example flow diagram for implementing a simulation of cloth on a GPU in accordance with an embodiment of the present invention. In other words, FIG. 9 represents a high-level depiction of a particular implementation of physics simulation block 410 described above with reference to FIG. 4. In FIG. 9, the large circles represent textures or arrays of video memory, which may be similar to textures 310 described above with reference to FIG. 3. The particular mapping of data to textures is as follows: (i) circles 902 (labeled M) represent a texture containing data relating to the mass of each point in point-mesh 800; (ii) circles 904 (labeled P) represent a texture containing data relating to the position of each point in point-mesh 800; (iii) circles 906 (labeled P) represent a texture containing data relating to the velocity of each point in point-mesh 800; (iv) circles 908 (labeled F) represent a texture containing data relating to the net force acting on each point in point-mesh 800; and (v) circles 912 (labeled J) represent a texture containing data relating to the Jacobean matrices. Shaded circles 910 represent kernel operations (such as mathematical computations performed by one or more GPUs).

The first step for implementing a simulation of cloth on a GPU involves mapping physical parameters associated with a point-mesh into textures (i.e., video memory) to set up a linear system of equations that governs motion of the point-mesh, as shown in FIG. 9. By applying an implicit integration technique, it was set forth above that the linear system of equations that governs motion of the point-mesh may be written as $A\vec{x} = \vec{b}$, wherein:

$$A = \left( I - \Delta t \cdot M^{-1} \cdot \frac{\partial \vec{f}}{\partial \vec{x}} \bigg|_k - \Delta t^2 \cdot M^{-1} \cdot \frac{\partial \vec{f}}{\partial \vec{x}} \bigg|_k \right); \quad \text{(Eq. 9a)}$$

$$\vec{x} = \left( \vec{x}^{k+1} - \vec{x}^k \right); \quad \text{(Eq. 9b)}$$

and $$b = \Delta t \cdot M^{-1} \cdot \left( \vec{f}^k + \Delta t \cdot \frac{\partial \vec{f}}{\partial \vec{x}} \bigg|_k \cdot \dot{\vec{x}}^k \right). \quad \text{(Eq. 9c)}$$

The mass, position, and initial velocity of a point-mesh being modeled are established by an artist creating a scene. Consequently, textures 902a, 904a, and 906a (corresponding to the mass, position, and initial velocity, respectively) may be filled immediately. In contrast, the Jacobean matrices and all the components of the net force are not established by the artist. Consequently a kernel operation 910a evaluates the force and Jacobean matrices (i.e., $$\left\{ \vec{f}, \partial \vec{f}/\partial \vec{x}, \partial \vec{f}/\partial \dot{\vec{x}} \right\} )$$

based on input from textures 904a, 906a, and 908a. The results of this evaluation are written into textures 908b and 912b. After these results are written into textures 908b and 912b, the system setup step is complete for this time-step.

The second step for implementing a simulation of cloth on a GPU involves solving the linear system for updated values of position and velocity (i.e., $$\left\{ \vec{x}^{k+1}, \dot{\vec{x}}^{k+1} \right\} ),$$

as shown in FIG. 9. A kernel operation 910b solves the linear system of equations based on input from textures 902a, 904a, 906a, 908b, and 912b. Based on this solution, updated values of position and velocity are written into textures 904b and 906b, respectively. After the updated values are written, the system solver step is complete for this time-step.

The final step for implementing a simulation of cloth on a GPU involves collision detection, as shown in FIG. 9. A kernel operation 910c determines whether collisions occur based on input from textures 902a, 904b, 906b, and 908b. The results of kernel operation 910c are written into texture 902b, 904c, 906c, and 908c. After these results are written, the collision response step is complete for this time-step.

Each of the steps for implementing a simulation of cloth on a GPU is now described in more detail.

i. Step One: System Setup

A significant design challenge of a GPU implementation is the development of a texture representation of the system equations that is both compact and facilitates single instruction multiple data (SIMD) parallelization. An embodiment of the present invention, utilizes 17 persistent textures with structures derived directly from the rectangular point-mesh under consideration. However, the invention is not limited to 17 textures. A person skilled in the relevant art(s) will understand how to perform physics simulations on the GPU using a different number textures without deviating from the spirit and scope of the present invention.

The textures used to simulate cloth as described herein are two-dimensional textures of n texels with heights of 'rows' and widths of 'cols' corresponding to point-mesh 800, which is organized into rows and columns of 'rows' and 'cols' elements respectively. Accordingly, each texel location of each texture maps one-to-one to a particular point of point-mesh 800. Each texture is ordered left-to-right top-to-bottom. In general, individual textures store different properties pertaining to the same point i at the same texture-coordinate {s, t}. (For clarity this document depicts all texture coordinates as un-normalized integers bound by a height='rows' and width='cols'). The mappings from a point's number to its texture-coordinates, and vice-versa, are given-by $$s \leftarrow i \bmod cols;$$

$$t \leftarrow \lfloor i/cols \rfloor; \text{ and}$$

$$i \leftarrow t \cdot cols + s.$$

Furthermore, subject to boundary conditions, the point offsets of the joint topology shown in FIG. 8 also maps to two-dimensional texture offsets as shown in Table 18.

TABLE 18

| Joint | Point Offset | Texture Offset |
|---|---|---|
| Stretch-Horizontal | ±1 | {±1, 0} |
| Stretch-Vertical | ±cols | {0, ±1} |
| Shear-Negative-Diagonal | ±cols − 1 | {−1, ±1} |
| Shear-Positive-Diagonal | ±cols + 1 | {+1, ±1} |
| Bend-Horizontal | ±2 | {±2, 0} |
| Bend-Vertical | ±2 − cols | {0, ±2} |

The 17 textures are labeled P, V, F, A#, B#, C, and D, wherein A# and B# are each collections of six textures. For each point $i \leftrightarrow$ texel {s,t} the contents of the 17 textures are then given by the following definitions. First, textures P, V, and F represent $$\vec{x}^k, \dot{\vec{x}}^k,$$

and $\vec{f}^k$, respectively. In particular:
  P stores the three components of a point's present position $x_i^k$;
  V stores the three components of a point's present velocity $\dot{x}_i^k$; and
  F stores the three components of a point's present net force vector $f_i^k$.

Second, A# and B# represent the lower-triangular (off-diagonal elements) of $\partial \vec{f}/\partial \vec{x}$ and $$\partial \vec{f}/\partial \dot{\vec{x}}$$

respectively. In particular:
  A#: stores the {3×3} matrix corresponding to a $\partial f_i^k / \partial x_j$; and
  B#: stores the {3×3} matrix corresponding to $\partial f_i^k / \partial \dot{x}_j$;
    wherein A0-A5 and B0-B5 are defined for each of the following six joints:
    m=0→j=i+1 (stretch);
    m=1→j=i+2 (bend);
    m=2→j=i+cols−1 (shear);
    m=3→j=i+cols (stretch);
    m=4→j=i+cols+1 (shear); and
    m=5→j=i+2−cols (bend).
Third, textures C and D represent on-diagonal elements of $\partial \vec{f}^k/\partial \vec{x}$ and $$\frac{\partial \vec{f}^k}{\partial \dot{\vec{x}}},$$

respectively. In particular:
  C: stores the {3×3} matrix corresponding to $\partial f_i^k / \partial x_j$; and
  D: stores the {3×3} matrix corresponding to $\partial f_i^k / \partial \dot{x}_j$.

Figure 10:
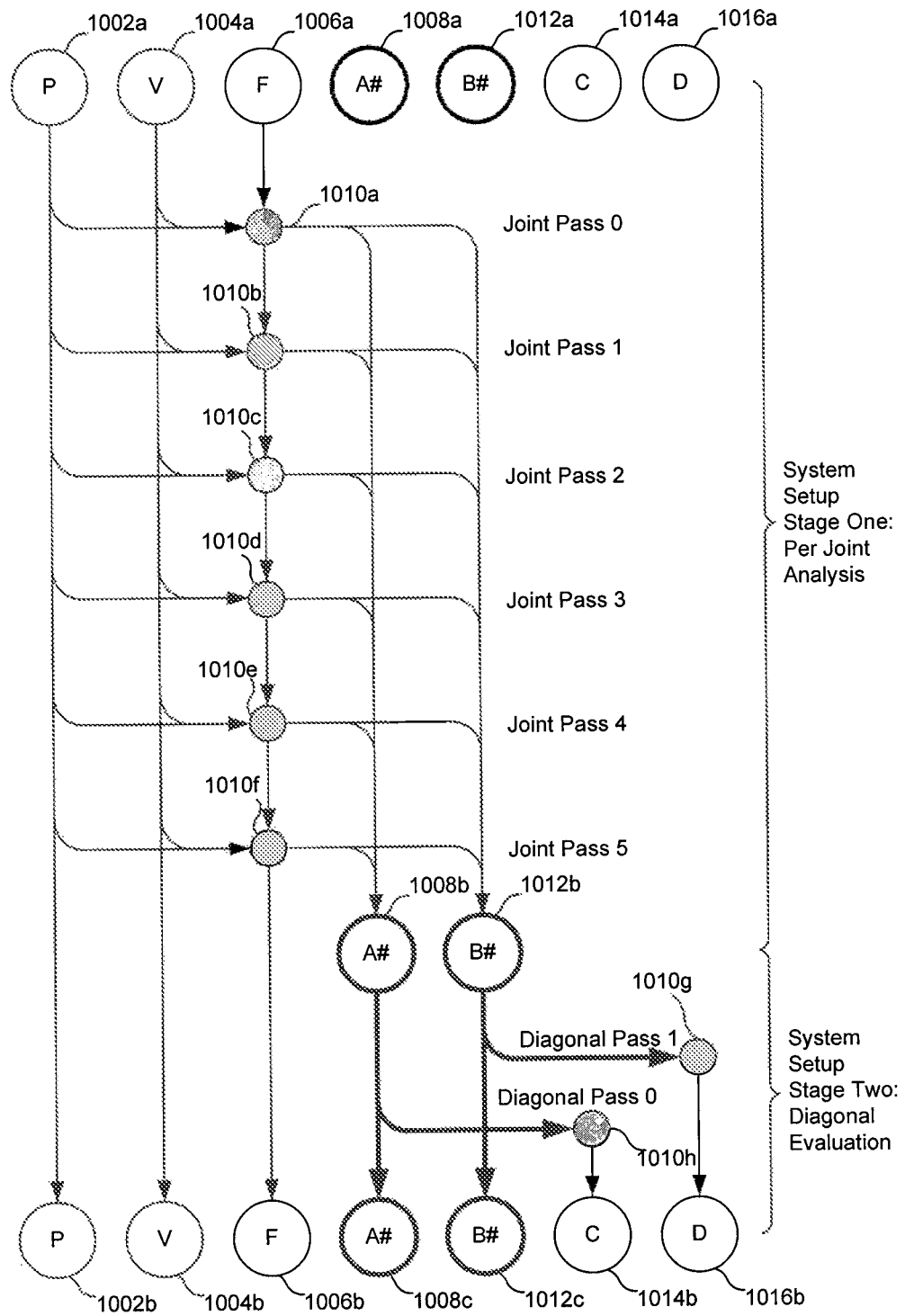
FIG. 10 depicts an example two-step flow diagram for mapping physical parameters associated with a point-mesh into video memory in accordance with an embodiment of the present invention.

Having defined the 17 textures, a two-stage process for filling these textures (i.e., for performing the system set-up step of FIG. 9) is now described. FIG. 10 depicts a flow diagram of a two-stage process for setting up a linear system of equations that governs motion of point-mesh 800. Included in FIG. 10 are input textures 1002a and 1004a (corresponding to P: $\vec{x}^k$ and $$V: \dot{\vec{x}}^k),$$

and output textures 1006a, 1008a, 1012a, 1014a, and 1016a (corresponding to F: $\vec{f}^k$, {A#,C}:$\partial \vec{f}^k/\partial \vec{x}$, and $$\{B\#, D\}: \partial \vec{f}^k / \partial \dot{\vec{x}}).$$

The first stage of FIG. 10 involves six identical sub-passes represented by kernel operations 1010a-1010f that operate for complementary pairs of joints. In this first stage, the net-force vector $\vec{f}^k$ (i.e., texture F) and the lower-triangular (off-diagonal elements) of $\partial \vec{f}/\partial \vec{x}$ and $$\partial \vec{f}/\partial \dot{\vec{x}}$$

(i.e., textures A0-A5 and B0-B5) are determined. That is, the results of kernel operations 1010a-1010f are written into textures 1002b, 1004b, 1008c, 1006b, 1008b, and 1012b.

The second stage of FIG. 10 involves two identical sub-passes represented by kernel operations 1010g and 1010h that determine the diagonal elements of $\partial \vec{f}/\partial \vec{x}$ and $$\frac{\partial \vec{f}}{\partial \dot{\vec{x}}}$$

(i.e., textures C and D) from their lower-triangular off-diagonal elements (i.e., textures A0-A5 and B0-B5). That is, the results of kernel operations 1010g and 1010h are written into textures 1016b and 1014b, respectively. The first stage and the second stage will each be described in more detail below.

The first-stage of system-setup (FIG. 10) involves determining the net-force vector $\vec{f}^k$ (i.e., texture C) and the lower-triangular (off-diagonal elements) of $\partial \vec{f}/\partial \vec{x}$ and $$\partial \vec{f}/\partial \vec{\dot{x}}$$

(i.e., textures A0-A5 and B0-B5). As shown in FIG. 10, the evaluation of these outputs may involve significant duplication of per joint analysis, as represented by kernel operations 1010a-1010f. Consequently, this first stage may be broken into six identical per joint sub-passes, as represented in FIG. 11.

Figure 11:
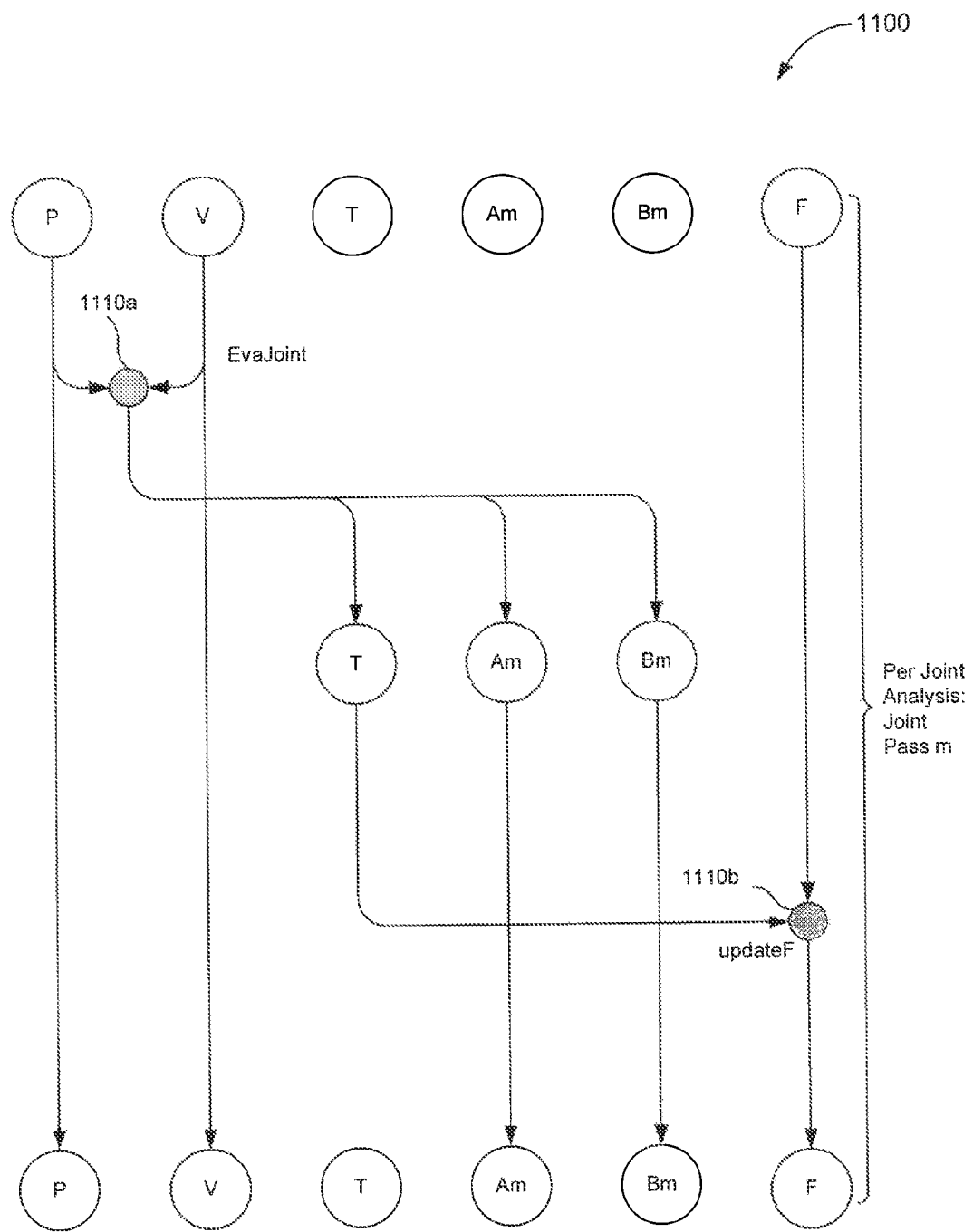
FIG. 11 depicts an example flow diagram for determining a net force and a non-diagonal portion of a Jacobean matrix on a per-joint basis in accordance with an embodiment of the present invention.

FIG. 11 depicts a flow diagram 1100 representing a joint pass m. Each joint pass includes two sub-passes, represented by a first kernel 1110a (labeled EvaJoint) and a second kernel 1110b (labeled updateF). First kernel 1110a calculates per joint values for $f_y^k$, $\partial f_y^k/\partial x_j$, $\partial f_y^k/\partial \dot{x}_j$ which are written to temporary textures T, Am, and Bm, respectively. The particular joint analyzed per sub-pass relates to textures Am and Bm by $m=0 \rightarrow j=i+1$ $m=1 \rightarrow j=i+2$ $m=2 \rightarrow j=i+cols-1$ $m=3 \rightarrow j=i+cols$ $m=4 \rightarrow j=i+cols+1$ $m=5 \rightarrow j=i+2 \cdot cols$ First kernel 1110a (evalJoint) takes advantage of the following facts:
(1) Per joint values are most readily evaluated together;
(2) The off-diagonal elements of $\partial \vec{f}/\partial \vec{x}$ and $$\partial \vec{f}/\partial \vec{\dot{x}},$$

stored in Am and Bm are in fact independent and equal to $\partial f_i^k/\partial x_j = \partial f_y^k/\partial x_j$ and of $\partial f_i^k/\partial \dot{x}_j = \partial f_y^k/\partial \dot{x}_j$; and
(3) By symmetry (i.e., $f_{ij}^k = -f_{ij}^k$, $\partial f_i^k/\partial x_h = \partial f_j^k/\partial x_i$ and $\partial f_i^k/\partial \dot{x}_j = \partial f_j^k/\partial \dot{x}_i$) complimentary joints involve identical analysis. It is therefore ideal (i.e., no replication of work) to analyze a unique half of the joints in our topology. Moreover, by symmetry, the lower-triangular (off-diagonal elements) of $\partial \vec{f}/\partial \vec{x}$ and $$\frac{\partial \vec{f}}{\partial \vec{\dot{x}}}$$

stored in textures A0-A5 and B0-B5 are sufficient to represent all off-diagonal elements in the Jacobeans.

Second kernel 1110b (labeled updateF) updates the net-force vector $\vec{f}^k$ (or texture) C with the forces of the joint being analyzed. Second kernel (updateF) adds the contribution of per joint forces $f_{ij}^k$ now stored in T, to an input net-force vector $\vec{f}^k$ or texture C (either coming from another sub-pass or containing external forces). It takes particular advantage of the linear independence of joint forces, and the symmetry provided by Newton's Third Law. Because each sub-pass effectively calculates the forces of complementary pairs of joints, second kernel 1110b (updateF) is responsible for addressing T to properly consider both contributions (due to boundary conditions certain values per joint forces in T may be inordinate).

Referring again to FIG. 10, the second and final stage of system-setup involves determining the diagonal elements of $\partial \vec{f}/\partial \vec{x}$ and $$\frac{\partial \vec{f}}{\partial \vec{\dot{x}}}$$

(i.e., textures C and D). In this second stage, the fact that these diagonal elements are well-structured summations of their off-diagonal elements is leveraged. In particular, each of the following summations include up to twelve terms, one for each joint (subject to boundary conditions) which are readily available in textures A0-A5 and B0-B5:

$$\frac{\partial f_i}{\partial x_i} = \sum_{k}^{k \neq 1} \frac{\partial f_{ik}}{\partial x_i} \qquad \text{(Eq. 13a)}$$

$$\frac{\partial f_i}{\partial \dot{x}_i} = \sum_{k}^{k \neq 1} \frac{\partial f_{ik}}{\partial \dot{x}_i}. \qquad \text{(Eq. 13b)}$$

Figure 12:
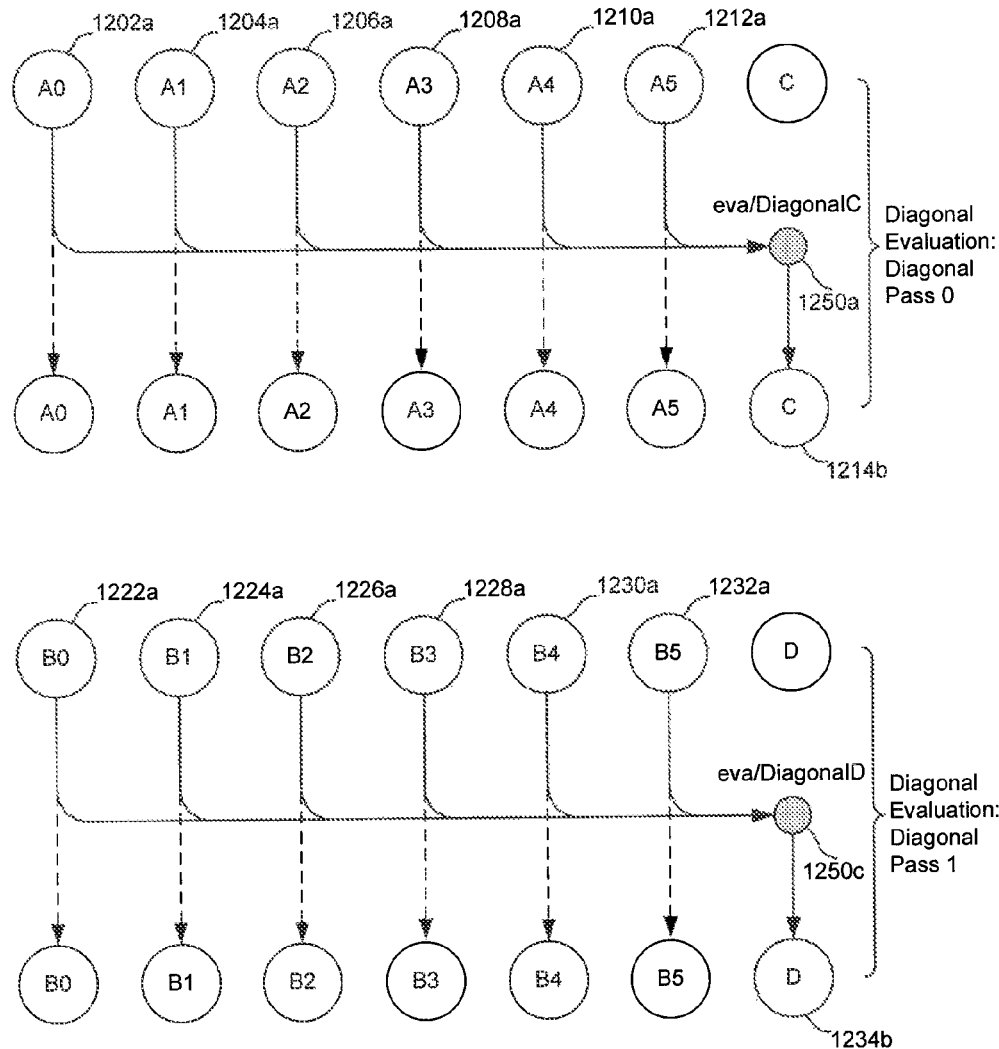
FIG. 12 depicts an example flow diagram for determining a diagonal portion of a Jacobean matrix on a per-joint basis in accordance with an embodiment of the present invention.

As graphically depicted in FIG. 12, the summation in Eq. 13a is evaluated by a kernel 1250a (labeled evalDiagonalC) and the summation in Eq. 13b is evaluated by a kernel 1250c (labeled evalDiagonalD). Kernels 1250a and 1250c are independent and only differ in their inputs and outputs. Kernel 1250a takes as input the data from textures 1202a, 1204a, 1206a, 1208a, 1210a, and 1212a, which collectively represent the off-diagonal elements of Jacobean matrix $\partial \vec{f}/\partial \vec{x}$. The output of kernel 1250a is written to texture 1214b (i.e., texture C). Kernel 1250c takes as input the data from textures 1222a, 1224a, 1226a, 1228a, 1230a, and 1232a, which collectively represent the off-diagonal elements of Jacobean matrix $$\frac{\partial \vec{f}}{\partial \vec{\dot{x}}}.$$

The output of kernel 1250c is written to texture 1234b (i.e., texture D).

ii. Step Two: System Solver

Referring again to FIG. 8, the second step in the simulation of cloth on a GPU is the system solver step. A dominant approach for the system solver step is to employ the Conjugate Gradient (CG) method for iteratively solving linear systems (i.e., $A\vec{x}=\vec{b}$), described in the aforementioned Baraff reference. Best suited to large sparse, symmetric and positive definite systems, the CG method involves procedurally approximating x until $\|\vec{b}-A\vec{x}\|$ falls below a user-defined threshold. Although the example method described herein uses the CG method for the system solver step, other methods may be used without deviating from the spirit and scope of the present invention as would be apparent to a person skilled in the relevant art(s).

iii. Step Three: Collision Response

Referring again to FIG. 8, the third and final step in the simulation of cloth on a GPU is the collision response step. A collision detection scheme checks whether a collision has occurred by determining whether a pair of points from the mesh being simulated (e.g., point-mesh 800) intersect with either (i) another pair of points from the mesh or (ii) a pair of points from another object being simulated (e.g., a ball that is depicted in the same scene as point-mesh 800). Collision detection schemes are well-known to persons skilled in the relevant art(s), as illustrated by the aforementioned Baraff reference. Any collision detection scheme known to persons skilled in the relevant art(s) may be used without deviating from the spirit and scope of the present invention.

D. Example Code Written in FYSL

Provided below are example sections of code written in FYSL. In particular, provided below are the following: (i) a high-level scene description written in FYSL; (ii) a child actors expansion; and (iii) a fabric joint prototype expansion.

i. High-Level Scene Description FYSL

```
<!-- fysl scene description -->
<Scene>
  <Name>cloth</Name>
  <Simulation>
    <Type>collision</Type>
    <TimeStep>1/60</TimeStep>
  </Simulation>
  <Actors>
    <Grid>
      <Width>4</Width>
      <Height>4</Height>
      <Depth>1</Depth>
    </Grid>
    <Actor>
      <Name>fabric</Name>
      <Type>dynamic</Type>
      <Id>0</Id>
      <!-- assuming super structure can be modeled as a point mass
           (i.e. sphere with zero radius) -->
      <Shape>
        <Sphere>
          <Position>.0 .0 .0</Position>
          <Radius>.0</Radius>
        </Sphere>
      </Shape>
      <Dynamics>
        <Linear>
          <Mass>1.</Mass>
          <Center>0.015 0.015 .0</Center>
          <Velocity>.0 .0 .0</Velocity>
          <Forces>
            <Directional>.0 .0 .0</Directional>
          </Forces>
        </Linear>
      </Dynamics>
      <!-- 4x4 children -->
      <Actors>...</Actors>
      <!--prototype tags for describing canonical cloth simulation
          parameters -->
      <Joints>...</Joints>
    <Feedback />
</Scene>
``` ii. Child Actors Expansion

```
<!-- 4x4 children -->
<Actors>
  <Actor>
    <Name>00</Name>
    <Type>dynamic</Type>
    <Id>0</Id>
    <Shape>
      <Sphere>
        <Position>.0 .0 .0</Position>
        <Radius>.0</Radius>
      </Sphere>
    </Shape>
    <Dynamics>
      <Linear>
        <Mass>1.</Mass>
        <Center>.0 .0 .0</Center>
        <Velocity>.0 .0 .0</Velocity>
        <Forces>
          <Directional>.0 .0 .0</Directional>
        </Forces>
      </Linear>
    </Dynamics>
  </Actor>
  <Actor>
    <Name>nm</Name>
    <Type>dynamic</Type>
    <Id>4n+m</Id>
    <Shape>
      <Sphere>
        <Position>n*0.01 m*0.01 .0</Position>
        <Radius>.0</Radius>
      </Sphere>
    </Shape>
    <Dynamics>
      <Linear>
        <Mass>1.</Mass>
        <Center>.0 .0 .0</Center>
        <Velocity>.0 .0 .0</Velocity>
        <Forces>
          <Directional>.0 .0 .0</Directional>
        </Forces>
      </Linear>
    </Dynamics>
  </Actor>
  <Actor>
    <Name>33</Name>
    <Type>dynamic</Type>
    <Id>15</Id>
    <Shape>
      <Sphere<>
        <Position>0.03 0.03 .0</Position>
        <Radius>.0</Radius>
      </Sphere>
    </Shape>
    <Dynamics>
      <Linear>
        <Mass>1.</Mass>
        <Center>.0 .0 .0</Center>
        <Velocity>.0 .0 .0</Velocity>
        <Forces>
          <Directional>.0 .0 .0</Directional>
        </Forces>
      </Linear>
    </Dynamics>
  </Actor>
</Actors>
``` iii. Fabric Joint Prototype Expansion

```
<!-- prototype tags for describing canonical cloth simulation
parameters -->
<Joints>
  <Spring>
    <Action>Stretch</Action>
    <RestLength >0.01</ RestLength>
    <Stiffness>1e5</Stiffness>
    <Dampening>1e-3</Dampening>
  </Spring>
  <Spring>
    <Action>Shear</Action>
    <RestLength >0.01414</RestLength>
    <Stiffness>1e3</Stiffness>
    <Dampening>1e-2</Dampening>
```

```
    </Spring>
    <Spring>
        <Action>Bend</Action>
        <RestLength>0.02</RestLength>
        <Stiffness>1e2</Stiffness>
        <Dampening>1e-2</Dampening>
    </Spring>
</Joints>
```

IV. EXAMPLE COMPUTER IMPLEMENTATION

Embodiments of the present invention may be implemented using hardware, software or a combination thereof and may be implemented in one or more computer systems or other processing systems. However, the manipulations performed by the present invention were often referred to in terms, such as adding or comparing, which are commonly associated with mental operations performed by a human operator. No such capability of a human operator is necessary, or desirable in most cases, in any of the operations described herein which form part of the present invention. Rather, the operations are machine operations. Useful machines for performing the operation of the present invention include digital computers, such as personal computers, video game consoles, mobile telephones, personal digital assistants, or similar devices.

Figure 13:
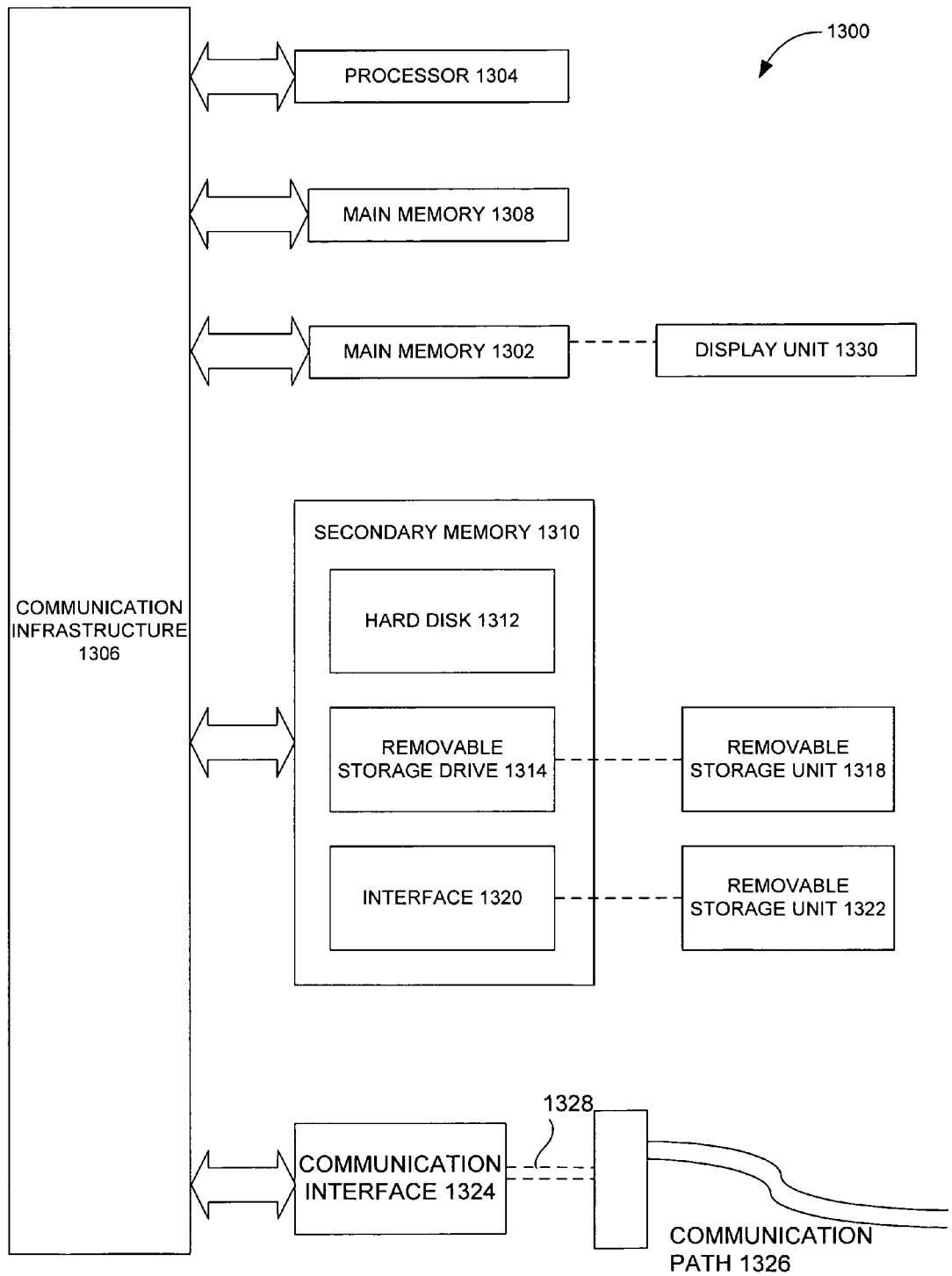
FIG. 13 depicts a block diagram of an example computer system in which an embodiment of the present invention may be implemented.

In fact, in one embodiment, the invention is directed toward one or more computer systems capable of carrying out the functionality described herein. An example of a computer system 1300 is shown in FIG. 13.

The computer system 1300 includes one or more processors, such as processor 1304. Processor 1304 may be a general purpose processor (such as, a CPU) or a special purpose processor (such as, a GPU). Processor 1304 is connected to a communication infrastructure 1306 (e.g., a communications bus, cross-over bar, or network). Various software embodiments are described in terms of this exemplary computer system. After reading this description, it will become apparent to a person skilled in the relevant art(s) how to implement the invention using other computer systems and/or architectures.

Computer system 1300 includes a display interface 1302 that forwards graphics, text, and other data from communication infrastructure 1306 (or from a frame buffer not shown) for display on display unit 1330.

Computer system 1300 also includes a main memory 1308, preferably random access memory (RAM), and may also include a secondary memory 1310. The secondary memory 1310 may include, for example, a hard disk drive 1312 and/or a removable storage drive 1314, representing a floppy disk drive, a magnetic tape drive, an optical disk drive, etc. The removable storage drive 1314 reads from and/or writes to a removable storage unit 1318 in a well known manner. Removable storage unit 1318 represents a floppy disk, magnetic tape, optical disk, etc. which is read by and written to by removable storage drive 1314. As will be appreciated, the removable storage unit 1318 includes a computer usable storage medium having stored therein computer software and/or data.

In alternative embodiments, secondary memory 1310 may include other similar devices for allowing computer programs or other instructions to be loaded into computer system 1300. Such devices may include, for example, a removable storage unit 1322 and an interface 1320. Examples of such may include a program cartridge and cartridge interface (such as that found in video game devices), a removable memory chip (such as an erasable programmable read only memory (EPROM), or programmable read only memory (PROM)) and associated socket, and other removable storage units 1322 and interfaces 1320, which allow software and data to be transferred from the removable storage unit 1322 to computer system 1300.

Computer system 1300 may also include a communications interface 1324. Communications interface 1324 allows software and data to be transferred between computer system 1300 and external devices. Examples of communications interface 1324 may include a modem, a network interface (such as an Ethernet card), a communications port, a Personal Computer Memory Card International Association (PCMCIA) slot and card, etc. Software and data transferred via communications interface 1324 are in the form of signals 1328 which may be electronic, electromagnetic, optical or other signals capable of being received by communications interface 1324. These signals 1328 are provided to communications interface 1324 via a communications path (e.g., channel) 1326. This channel 1326 carries signals 1328 and may be implemented using wire or cable, fiber optics, a telephone line, a cellular link, an radio frequency (RF) link and other communications channels.

In this document, the terms "computer program medium" and "computer usable medium" are used to generally refer to media such as removable storage drive 1314, a hard disk installed in hard disk drive 1312, and signals 1328. These computer program products provide software to computer system 1300. The invention is directed to such computer program products.

Computer programs (also referred to as computer control logic) are stored in main memory 1308 and/or secondary memory 1310. Computer programs may also be received via communications interface 1324. Such computer programs, when executed, enable the computer system 1300 to perform the features of the present invention, as discussed herein. In particular, the computer programs, when executed, enable the processor 1304 to perform the features of the present invention. Accordingly, such computer programs represent controllers of the computer system 1300.

In an embodiment where the invention is implemented using software, the software may be stored in a computer program product and loaded into computer system 1300 using removable storage drive 1314, hard drive 1312 or communications interface 1324. The control logic (software), when executed by the processor 1304, causes the processor 1304 to perform the functions of the invention as described herein.

In another embodiment, the invention is implemented primarily in hardware using, for example, hardware components such as GPUs. Implementation of the hardware state machine so as to perform the functions described herein will be apparent to persons skilled in the relevant art(s).

In yet another embodiment, the invention is implemented using a combination of both hardware and software.

V. CONCLUSION

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

What is claimed is:

1. A method for performing physics simulations on at least one graphics processor unit (GPU), comprising:
   mapping physical parameters associated with at least one mesh into a plurality of three-dimensional texture memory arrays during first and second stages of a process, to set up a linear system of equations that governs motion of the at least one mesh depicted in a scene; wherein the plurality of three-dimensional texture memory arrays have a dimensionality configured to fit a maximum addressability of the GPU and each of the three-dimensional texture memory arrays has a one-to-one mapping to a point of the at least one mesh; and
   performing computations on data in the plurality of three-dimensional texture memory arrays using at least one pixel processor to solve the linear system of equations for an instant of time, the computations including:
      performing a first set of identical rendering sub-passes that operate on complementary joints between a first set of physical parameters associated with the at least one mesh, during the first stage, and
      performing a second set of identical rendering sub-passes that operate on the first set of physical parameters based on results of the first set of identical rendering sub-passes, during the second stage,
   wherein modified data representing the solution to the linear system of equations for the instant of time are stored in the plurality of three-dimensional texture memory arrays during a solver stage.

2. The method of claim 1, further comprising:
   updating the motion of the at least one mesh depicted in the scene for the instant of time based on the modified data in the plurality of three-dimensional texture memory arrays.

3. The method of claim 1, further comprising:
   identifying at least one collision that involves the at least one mesh for the instant of time; and
   updating the motion of the at least one mesh depicted in the scene for the instant of time based on (i) the modified data in the plurality of three-dimensional texture memory arrays and (ii) the at least one collision identified.

4. The method of claim 1, further comprising:
   performing computations on the modified data using the pixel processor to solve the linear system of equations for a next instant of time, wherein further modified data representing the solution to the linear system of equations for the next instant of time are stored in the plurality of three-dimensional texture memory arrays.

5. The method of claim 4, further comprising:
   updating the motion of the at least one mesh depicted in the scene for the next instant of time based on the further modified data in the plurality of three-dimensional texture memory arrays.

6. The method of claim 4, further comprising:
   identifying at least one collision that involves the at least one mesh for the next instant of time; and
   updating the motion of the at least one mesh depicted in the scene for the next instant of time based on (i) the further modified data in the plurality of three-dimensional texture memory arrays and (ii) the at least one collision identified.

7. The method of claim 1, wherein the performing computations comprises:
   performing computations on the data in the plurality of texture memory arrays using at least one pixel processor to solve the linear system of equations for an instant of time by implicitly integrating the linear system of equations, wherein modified data representing the solution to the linear system of equations for the instant of time are stored in the plurality of three-dimensional texture memory arrays.

8. The method of claim 1, wherein the mapping physical parameters comprises:
   storing data in a plurality of three-dimensional texture memory arrays to set up a linear system of equations, given by $A\vec{x}=\vec{b}$, that governs motion of at least one mesh depicted in a scene, wherein $$A = \left(I - \Delta t \cdot M^{-1} \cdot \frac{\partial \vec{f}(\vec{x}^k, \dot{\vec{x}}^k)}{\partial \dot{\vec{x}}} - \Delta t^2 \cdot M^{-1} \cdot \frac{\partial \vec{f}(\vec{x}^k, \dot{\vec{x}}^k)}{\partial \vec{x}}\right),$$

$$\vec{x} = (\dot{\vec{x}}^{k+1} - \dot{\vec{x}}^k), \text{ and}$$

$$\vec{b} = \Delta t \cdot M^{-1} \cdot \left(\vec{f}(\vec{x}^k, \dot{\vec{x}}^k) + \Delta t \cdot \frac{\partial \vec{f}(\vec{x}^k, \dot{\vec{x}}^k)}{\partial \vec{x}} \cdot \dot{\vec{x}}^k\right), \text{ and wherein}$$

I is an identity matrix, M is a diagonal matrix of masses of the at least one mesh, $\vec{x}^k$ is a vector representing a geometric state of the at least one mesh at time $$t_k, \dot{\vec{x}}^k$$

is a vector representing a velocity of each point in the at least one mesh, at time $t_k$, $$\vec{f}(\vec{x}^k, \dot{\vec{x}}^k)$$

and is a vector representing a net force on each point of the at least one mesh at time $t_k$.

9. The method of claim 1, wherein prior to the mapping the method further comprises:
   capturing a scene from a software dynamics solver and converting attributes and fields attached to at least one mesh depicted in the scene into the physical, parameters that are mapped into the plurality of three-dimensional texture memory arrays; and
   importing simulation results into a scene graph of the software dynamics solver, wherein the simulation results correspond to the solution to the linear system of equations for the instant of time computed by the at least one pixel processor.

10. The method of claim 1, further comprising:
    representing a force that acts on the mesh depicted in the scene as a shader that executes on the at least one GPU.

11. A computer program product comprising a non-transitory computer readable storage medium having control logic stored therein for causing at least one graphics processor unit (GPU) to execute a method for performing physics simulations, the method comprising:
    mapping, physical parameters associated with at least one mesh into a plurality of three-dimensional texture memory arrays, during first and second stages of a process, to set up a linear system of equations that governs motion of the at least one mesh, depicted in a scene; wherein the plurality of texture memory arrays have a dimensionality configured to fit a maximum addressability of the GPU and each of the texture memory arrays has a one-to-one mapping to a point of the at least one mesh; and performing computations on data in the plurality of three-dimensional texture memory arrays using at least one pixel processor to solve the linear system of equations for an instant of time, the computations including:

performing a first set of identical rendering sub-passes that operate on complementary joints between a first set of physical parameters associated with the at least one mesh, during the first stage, and performing a second set of identical rendering sub-passes that operate on the first set of physical parameters based on results of the first set of identical rendering sub-passes, during the second stage, wherein modified data representing the solution to the linear system of equations for the instant of time are stored in the plurality of three-dimensional texture memory arrays during a solver stage.

12. The computer program product of claim 11, wherein the method further comprises:

updating the motion of the at least one mesh depicted in the scene for the instant of time based on the modified data in the plurality of three-dimensional texture memory arrays.

13. The computer program product of claim 12, wherein the method further comprises:

identifying at least one collision that involves the at least one mesh for the instant of time; and updating the motion of the at least one mesh depicted in the scene for the instant of time based on (i) the modified data in the plurality of three-dimensional texture memory arrays and (ii) the at least one collision.

14. The computer program product of claim 11, wherein the method further comprises:

performing computations on the modified data to solve the linear system of equations for a next instant of time, wherein further modified data representing the solution to the linear system of equations for the next instant of time are stored in the plurality of three-dimensional texture memory arrays.

15. The computer program product of claim 14, wherein the method further comprises:

updating the motion of the at least one mesh depicted in the scene for the next instant of time based on the further modified data in the plurality of three-dimensional texture memory arrays.

16. The computer program product of claim 14, wherein the method further comprises:

identifying at least one collision that involves the at least one mesh for the next instant of time; and updating the motion of the at least one mesh depicted in the scene for the next instant of time based on (i) the further modified data in the plurality of three-dimensional texture memory arrays and (ii) the at least one collision.

17. The computer program product of claim 11, wherein the performing computations on data in the plurality of three-dimensional texture memory arrays to solve the linear system of equations for an instant of time comprises:

implicitly integrating the linear system of equations.

18. The computer program product of claim 11, wherein the mapping physical parameters comprises:

storing data in a plurality of three-dimensional texture memory arrays to set up a linear system of equations, given by $A\vec{x}=\vec{b}$, that governs motion of the least one mesh depicted in a scene, wherein $$A = \left(I - \Delta t \cdot M^{-1} \cdot \frac{\partial \vec{f}(\vec{x}^k, \dot{\vec{x}}^k)}{\partial \vec{x}} - \Delta t^2 \cdot M^{-1} \cdot \frac{\partial \vec{f}(\vec{x}^k, \dot{\vec{x}}^k)}{\partial \vec{x}}\right),$$

$$\vec{x} = (\dot{\vec{x}}^{k+1} - \dot{\vec{x}}^k), \text{ and}$$

$$\vec{b} = \Delta t \cdot M^{-1} \cdot \left(\vec{f}(\vec{x}^k, \dot{\vec{x}}^k) + \Delta t \cdot \frac{\partial \vec{f}(\vec{x}^k, \dot{\vec{x}}^k)}{\partial \vec{x}} \cdot \dot{\vec{x}}^k\right), \text{ and wherein}$$

I is an identity matrix, M is a diagonal matrix of masses of the at least one mesh, $\vec{x}^k$ is a vector representing a geometric state of the at least one mesh at time $$t_k, \dot{\vec{x}}^k$$

is a vector representing a velocity of each point in the at least one mesh at time $t_k$, and $$\vec{f}(\vec{x}^k, \dot{\vec{x}}^k)$$

is a vector representing a net force on each point in the at least one mesh at time $t_k$.

19. The computer program product of claim 11, wherein the method further comprises:

capturing a scene from a software dynamics solver and converting, attributes and fields attached to at least one mesh depicted in the scene into the physical parameters that are mapped into the plurality of three-dimensional texture memory arrays; and importing simulation results into a scene graph of the software dynamics solver, wherein the simulation results correspond to the solution to the linear system of equations for the instant of time.

20. The computer program product of claim 11, wherein the method further comprises:

simulating a force that acts on the mesh depicted in the scene.

21. A system for performing physics simulations on at least one graphics processor unit (GPU), comprising:

a memory that includes a plurality of optimized three-dimensional texture memory arrays that store data representing physical parameters associated with at least one mesh, wherein the plurality of optimized three-dimensional texture memory arrays are filled with data during first and second stages of a process, to set up a linear system of equations that governs motion of the at least one mesh depicted in a scene; wherein the plurality of optimized texture memory arrays have a dimensionality configured to fit a maximum addressability of the GPU and each of the optimized three-dimensional texture memory arrays has a one-to-one mapping to a point of the at least one mesh; and at least one pixel processor coupled to the three-dimensional texture memory arrays that performs computations on the data in the plurality of optimized three-dimensional texture memory arrays to solve the linear system of equations for an instant of time, the computations including the at least one pixel processor configured to:

perform a first set of identical rendering sub-passes that operate on complementary joints between a first set of physical parameters associated with the at least one mesh, during the first stage, and perform a second set of identical rendering sub-passes that operate on the first set of physical parameters based on results of the first set of identical rendering sub-passes, during the second stage, wherein modified data representing the solution to the linear system of equations for the instant of time are stored in the plurality of optimized texture memory arrays during a solver stage.

22. The system of claim 21, further comprising:

a rendering engine that updates a depiction of the at least one mesh depicted in the scene for the instant of time based on the modified data in the plurality of optimized three-dimensional texture memory arrays.

23. The system of claim 21, wherein the pixel processor identifies at least one collision that involves the at least one mesh for the instant of time, and wherein the system further comprises:

a rendering engine that updates a depiction of the at least one mesh depicted in the scene for the instant of time based on (i) the modified data in the plurality of optimized three-dimensional texture memory arrays and (ii) the at least one collision identified at the instant of time.

24. The system of claim 21, wherein the pixel processor performs computations on the modified data to solve the linear system of equations for a next instant of time, wherein further modified data representing the solution to the linear system of equations for the next instant of time are stored in the plurality of optimized three-dimensional texture memory arrays.

25. The system of claim 24, further comprising:

a rendering engine that updates a depiction of the at least one mesh depicted in the scene for the next instant of time based on the further modified data in the plurality of optimized three-dimensional texture memory arrays.

26. The system of claim 24, wherein the pixel processor identifies at least one collision that involves the at least one mesh for the next instant of time, and wherein the system further comprises:

a rendering engine that updates a depiction of the at least one mesh depicted in the scene for the next instant of time based on (i) the further modified data in the plurality of optimized three-dimensional texture memory arrays and (ii) the at least one collision identified at the next instant of time.

27. The system of claim 21, wherein the pixel processor performs computations on the data in the plurality of optimized three-dimensional texture memory arrays to solve the linear system of equations for an instant of time by implicitly integrating the linear system of equations to solve the linear system of equations, wherein modified data representing the solution to the linear system of equations for the instant of time are stored in the plurality of optimized three-dimensional texture memory arrays.

28. The system of claim 21, wherein the linear system of equations is given by $A\vec{x}=\vec{b}$, wherein $$A = \left(I - \Delta t \cdot M^{-1} \cdot \frac{\partial \vec{f}(\vec{x}^k, \dot{\vec{x}}^k)}{\partial \dot{\vec{x}}} - \Delta t^2 \cdot M^{-1} \cdot \frac{\partial \vec{f}(\vec{x}^k, \dot{\vec{x}}^k)}{\partial \vec{x}}\right),$$

$$\vec{x} = \left(\dot{\vec{x}}^{k+1} - \dot{\vec{x}}^k\right), \text{ and}$$

$$\vec{b} = \Delta t \cdot M^{-1} \cdot \left(\vec{f}(\vec{x}^k, \dot{\vec{x}}^k) + \Delta t \cdot \frac{\partial \vec{f}(\vec{x}^k, \dot{\vec{x}}^k)}{\partial \vec{x}} \cdot \dot{\vec{x}}^k\right), \text{ and wherein}$$

I is an identity matrix, M is a diagonal matrix of masses of the at least one mesh, $\vec{x}^k$ is a vector representing a geometric state of the at least one mesh at time $$t_k, \dot{\vec{x}}^k$$

is a vector representing a velocity of each point in the at least one mesh at time $t_k$, and $$\vec{f}(\vec{x}^k, \dot{\vec{x}}^k)$$

is a vector representing a net force on each point in the at least one mesh at time $t_k$.

29. The system of claim 21, further comprising:

a scene exporter that captures a scene from a software dynamics solver and converts attributes and fields attached to at least one mesh depicted in the scene into the physical parameters that are stored in the plurality of optimized three-dimensional texture memory arrays; and a scene importer that imports simulation results into a scene graph of the software dynamics solver, wherein the simulation results correspond to the solution to the linear system of equations for the instant of time computed by the at least one pixel processor.

30. The system of claim 21, further comprising:

a shader that executes on at least one GPU to represent a force that acts on the mesh depicted in the scene.

31. A computer program product comprising a non-transitory computer readable storage medium containing instructions which when executed on a computing device define at least one graphics processor unit (GPU), wherein the at least one GPU is configured to execute a method for performing physics simulations, the method comprising:

mapping physical parameters associated with at least one mesh into a plurality of optimized three-dimensional texture memory arrays, during first and second stages of a process, to set up a linear system of equations that governs motion of the at least one mesh depicted in a scene, wherein the plurality of optimized texture memory arrays have a dimensionality configured to fit a maximum addressability of the GPU and each of the optimized three-dimensional texture memory arrays has a one-to-one mapping to a point of the at least one mesh; and performing computations on data in the plurality of optimized three-dimensional texture memory arrays using at least one pixel processor to solve the linear system of equations for an instant of time, the computations including:

performing a first set of identical rendering sub-passes that operate on complementary joints between a first set of physical parameters associated with the at least one mesh, during the first stage, and performing a second set of identical rendering sub passes that operate on the first set of physical parameters based on results of the first set of identical rendering sub-passes, during the second stage, wherein modified data representing the solution to the linear system of equations for the instant of time are stored in the plurality of optimized three-dimensional texture memory arrays during a solver stage.

\* \* \* \* \*

UNITED STATES PATENT AND TRADEMARK OFFICE
CERTIFICATE OF CORRECTION

PATENT NO. : 8,666,712 B2  
APPLICATION NO. : 11/491169  
DATED : March 4, 2014  
INVENTOR(S) : Bleiweiss et al.

Page 1 of 1

It is certified that error appears in the above-identified patent and that said Letters Patent is hereby corrected as shown below:

In the Claims

<u>Column 40</u>

Line 45 please replace "physical, parameters" with --physical parameters--.

Signed and Sealed this  
Fifth Day of August, 2014

Michelle K. Lee  
*Deputy Director of the United States Patent and Trademark Office*